(12) United States Patent
Kawahito et al.

(10) Patent No.: US 8,891,978 B2
(45) Date of Patent: Nov. 18, 2014

(54) INFORMATION-ACQUISITION DEVICE AND OPTICAL COMMUNICATION SYSTEM

(75) Inventors: Shoji Kawahito, Hamamatsu (JP); Isamu Takai, Aichi-gun (JP); Michinori Ando, Aichi-gun (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 798 days.

(21) Appl. No.: 13/119,861

(22) PCT Filed: Sep. 18, 2009

(86) PCT No.: PCT/JP2009/066421
§ 371 (c)(1),
(2), (4) Date: Jun. 8, 2011

(87) PCT Pub. No.: WO2010/032842
PCT Pub. Date: Mar. 25, 2010

(65) Prior Publication Data
US 2011/0226935 A1    Sep. 22, 2011

(30) Foreign Application Priority Data
Sep. 19, 2008    (JP) ................................ 2008-240578

(51) Int. Cl.
*H04B 10/06*    (2006.01)
*H04N 5/378*    (2011.01)
*H04N 5/374*    (2011.01)
*H04N 5/355*    (2011.01)
*H01L 27/146*   (2006.01)

(52) U.S. Cl.
CPC .............. *H04N 5/378* (2013.01); *H04N 5/374* (2013.01); *H04N 5/35518* (2013.01); *H01L 27/14609* (2013.01); *H01L 27/14603* (2013.01); *H01L 27/14643* (2013.01)
USPC ........................... 398/207; 398/209; 398/213

(58) Field of Classification Search
USPC .................................................. 398/203–214
See application file for complete search history.

(56) References Cited

U.S. PATENT DOCUMENTS 4,648,135 A    3/1987    Labrum et al.
5,861,621 A    1/1999    Takebe et al.
(Continued)

FOREIGN PATENT DOCUMENTS

EP    1 580 987 A1    9/2005
EP    1 648 160 A1    4/2006
(Continued)

OTHER PUBLICATIONS

English Translation of International Preliminary Report on Patentability with Written Opinion issued on Apr. 28, 2011 in Application No. PCT/JP2009/066421.

(Continued)

*Primary Examiner* — Dzung Tran
(74) *Attorney, Agent, or Firm* — Oblon, Spivak, McClelland, Maier & Neustadt, L.L.P.

(57) ABSTRACT

At least one cell implementing a sensor array embraces a photoelectric-conversion accumulation element configured to generate and accumulate signal charges, a potential detection circuit configured to detect the signal charges generated by the photoelectric-conversion accumulation element as a potential change, and an amplification circuit configured to amplify the potential change and to transmit to an output-signal line. The photoelectric-conversion accumulation element and the potential detection circuit are connected in series between a first potential terminal and a second potential terminal, and the potential detection circuit has an insulated-gate transistor, which detects the potential change in a weak inversion state, in a period when an optical-communication signal is received.

12 Claims, 18 Drawing Sheets

(56) References Cited

U.S. PATENT DOCUMENTS

| | | | |
|---|---|---|---|
| 7,729,601 B1* | 6/2010 | Tsai | 396/77 |
| 2002/0054389 A1 | 5/2002 | Takada et al. | |
| 2004/0101309 A1 | 5/2004 | Beyette, Jr. et al. | |
| 2006/0001918 A1* | 1/2006 | Okano et al. | 358/482 |
| 2011/0197662 A1* | 8/2011 | McAlister | 73/61.59 |

FOREIGN PATENT DOCUMENTS

| | | |
|---|---|---|
| JP | 10 90058 | 4/1998 |
| JP | 2002 77733 | 3/2002 |
| JP | 2003 258736 | 9/2003 |
| JP | 2006 32564 | 2/2006 |

OTHER PUBLICATIONS

Kagawa, K., et al., "A vision chip for optical wireless LAN using a BiCMOS process," The Institute of Image Information and Television Engineers (ITE), Special Interest Group on Information Sensing and Consumer Electronics, ITE Technical Report, vol. 26, No. 26, total 6 pages, (2002) (with English abstract).

International Search Report issued Dec. 15, 2009 in PCT/JP09/066421 filed Sep. 18, 2009.

Extended European Search Report issued Apr. 10, 2014 in Patent Application No. 09814686.3.

European Search Report issued May 7, 2014 in Patent Application No. 09814686.3.

\* cited by examiner

|  | OPTICAL-SIGNAL RECEIVED | OPTICAL-SIGNAL NOT RECEIVED |
|---|---|---|
| RESET-TRANSISTOR 14 | ON | OFF |
| READ-OUT SWITCH SW10 | ON | OFF |

(b)

|  | ON CAMERA | OFF-CAMERA |
|---|---|---|
| RESET-TRANSISTOR 14 | ON → OFF (INITIALIZATION) | OFF |
| READ-OUT SWITCH SW10 | OFF → ON (CHARGE ACCUMULATION) (CHARGE TRANSFER) | OFF |

|  | OPTICAL-SIGNAL RECEIVED | OPTICAL-SIGNAL NOT RECEIVED |
|---|---|---|
| RESET-TRANSISTOR 14 | ON | OFF |
| BARRIER TRANSISTOR 17 | ON | OFF |

(b)

|  | ON CAMERA | OFF-CAMERA |
|---|---|---|
| RESET-TRANSISTOR 14 | ON → OFF | OFF |
| BARRIER TRANSISTOR 17 | ON → OFF (INITIALIZATION) (CHARGE ACCUMULATION) → ON (CHARGE TRANSFER) | OFF |

INFORMATION-ACQUISITION DEVICE AND OPTICAL COMMUNICATION SYSTEM

TECHNICAL FIELD

The present invention relates to an information-acquisition device, which can acquire optical-communication signal information, and an optical communication system, which uses the information-acquisition device.

BACKGROUND ART

Patent-Document 1 and Patent-Document 2 disclose respectively examples of information-acquisition devices, each of which can acquire both of picture-information and optical-communication signal information. The information-acquisition devices disclosed in those documents use a CMOS image sensor, and their features lie in a structure in which a unit cell implementing one pixel has both of a function of acquiring the picture-information and a function of acquiring the optical-communication signal information. FIG. 18 shows an outline of a circuit configuration of the cell disclosed in those documents.

As shown in FIG. 18, a cell 100 of the earlier information-acquisition device encompasses a photodiode 111, a reset-transistor 114, a buffer circuit 115, a read-out switch SW100, two of mode-exchanging switches SW200, 300, a current amplification circuit 120, a picture-information output-signal line SL100 and an optical-communication signal information output-signal line SL110. By the way, the junction capacitance of the photodiode 111 serves as a charge-accumulation capacitor 112. In the earlier information-acquisition device, the picture-information acquired by the cell 100 is provided through the picture-information output-signal line SL100 to an output OUT2. The optical-communication signal information acquired by the cell 100 is provided through the optical-communication signal information output-signal line SL110 to an output OUT1.

In the picture-information acquiring-mode of the earlier information-acquisition device, when the mode-exchanging switch SW200 is turned off, the mode-exchanging switch SW300 is connected to a ground (GND) level. When a reset signal $V_{RST}$ in a pulse waveform is fed to a gate electrode of the reset-transistor 114, the reset-transistor 114 is turned on, and a charge quantity of the charge-accumulation capacitor 112 is initialized in response to a reset voltage $V_R$. After the initialization, the reset-transistor 114 is turned off. Thus, the interconnection on the input side of the buffer circuit 115 (the interconnection is typically formed by a floating diffusion layer in many cases) is turned into floating state. For this reason, an input voltage $V_{FD}$ of the buffer circuit 115 is varied in accordance with the charge quantity accumulated in the charge-accumulation capacitor 112. In the picture-information acquiring-mode, as the on and off sates of the read-out switch SW100 are exchanged, a charge accumulation period and a charge transfer period are exchanged. The period in which the read-out switch SW100 is in the off state is the charge accumulation period, and the period in which the read-out switch SW100 is the on state is the charge transfer period. In the charge accumulation period, when light is irradiated to the cell 100, charges are generated in the photodiode 111. When the generated charges are accumulated in the charge-accumulation capacitor 112, the input voltage $V_{FD}$ of the buffer circuit 115 is decreased. When the read-out switch SW100 is turned on after the elapse of a predetermined period, the input voltage $V_{FD}$ (or an amplification voltage based on the input voltage $V_{FD}$) is transferred through the buffer circuit 115 to the picture-information output-signal line SL100. Consequently, a voltage signal based on the picture-information is provided to the output OUT2.

In the optical-communication-signal information-acquiring mode of the earlier information-acquisition device, as the mode-exchanging switch SW200 is turned on, the mode-exchanging switch SW300 is connected to the side of the current amplification circuit 120. Moreover, in the optical-communication-signal information-acquiring mode, both of the reset-transistor 114 and the read-out switch SW100 are controlled to be in off sates. In the off state of the reset-transistor 114 and the read-out switch SW100, an optical communication signal is irradiated to the cell 100, and the charges are generated in the photodiode 111, and a very weak diode current flows. The current amplification circuit 120 amplifies the very weak diode current, and the amplified current is provided as an electric signal to the output OUT1. Consequently, a current signal based on the optical-communication signal information is provided to the output OUT1.

PRIOR ART CITATION

Patent Document

Patent-Document 1: JP-P 2003-258736A

Non-Patent Document

Non-Patent-Document 1: Keiichiro Kagawa, Tomohiro Nishimura, Takao Hirai, Jun Ota, Masahiro Nunosita, Yasushi Yamasaki, Masashi Yamada, Shozou Sugishita and Kunihiro Watanabe, "A vision chip for optical wireless LAN using a BiCMOS process [in Japanese]", The Institute of Image Information and Television Engineers (ITE), Special Interest Group on Information Sensing and Consumer Electronics, ITE Technical Report, Vol. 26, No. 26, p. 35-40 (Tokyo, 2002)

DISCLOSURE OF INVENTION

Technical Problem

The cell 100 in the earlier information-acquisition device shown in FIG. 18 uses the current amplification circuit 120, in order to acquire the optical-communication signal information. However, the use of the current amplification circuit 120 results in the technical problems, such as the increase in an element occupation area, the increase in electric power consumption and the generation of noise. By the way, in the above explanations of the background art, their technical problems are explained by exemplifying the information-acquisition device that can acquire both of the picture-information and the optical-communication signal information. However, the above technical problems are not limited to the case of the information-acquisition device that can acquire both of the picture-information and the optical-communication signal information. Even the information-acquisition device that can acquire only the optical-communication signal information, since using the current amplification circuit, has the technical problems, such as the increase in the element occupation area, the increase in the electric power consumption and the generation of the noise.

An object of the present invention is to provide an information-acquisition device facilitating a miniaturization of the element occupation area, which can decrease the electric power consumption and suppress the noise, and to provide an optical communication system that uses the information-acquisition device.

Technical Solution

A first aspect of the present invention inheres in an information-acquisition device encompassing a sensor array in which a plurality of cells are arrayed and a peripheral circuit configured to control an operation of each of the cells and to process signals transmitted from each of the cells. In the information-acquisition device pertaining to the first aspect of the present invention, at least one cell among the plurality of cells embraces a photoelectric-conversion accumulation element configured to generate and accumulate signal charges, a potential detection circuit configured to detect the signal charges generated by the photoelectric-conversion accumulation element as a potential change, and an amplification circuit configured to amplify the potential change and to transmit to an output-signal line. Then, the photoelectric-conversion accumulation element and the potential detection circuit are connected in series between a first potential terminal and a second potential terminal, and the potential detection circuit has an insulated-gate transistor, which detects the potential change in a weak inversion state, in a period when an optical-communication signal is received.

A second aspect of the present invention inheres in an optical communication system encompassing an information-transmission unit configured to transmit an optical-communication signal and an information reception unit having an information-acquisition device, which encompasses a sensor array in which a plurality of cells are arrayed, and a peripheral circuit configured to control an operation of each of the cells and to process signals transmitted from each of the cells. In the optical communication system pertaining to the second aspect of the present invention, at least one cell among the plurality of cells embraces a photoelectric-conversion accumulation element configured to generate and accumulate signal charges, a potential detection circuit configured to detect the signal charges generated by the photoelectric-conversion accumulation element as a potential change, and an amplification circuit configured to amplify the potential change and to transmit to an output-signal line. Then, the photoelectric-conversion accumulation element and the potential detection circuit are connected in series between a first potential terminal and a second potential terminal, and the potential detection circuit has an insulated-gate transistor, which detects the potential change in a weak inversion state, in a period when an optical-communication signal is received.

Advantageous Effects

According to the present invention, because the current amplification circuit is not used, it is possible to provide the information-acquisition device in which it is possible to miniaturize the element occupation area, reduce the electric power consumption and suppress the noise, and the optical communication system that uses the information-acquisition device.

BRIEF DESCRIPTION OF DRAWINGS

FIG. 6($a$) is a table showing driving architectures of a reset-transistor and a read-out transistor when an optical communication signal is received and not received, in the information-acquisition device pertaining to the first embodiment of the present invention, and FIG. 6($b$) is a table showing the driving architectures of the reset-transistor and the read-out transistor when a picture is imaged and not imaged.

FIG. 14($a$) is a table showing the driving architectures of a reset-transistor and a barrier transistor when the optical communication signal is received and not received, in an information-acquisition device pertaining to the fourth embodiment of the present invention, and FIG. 14($b$) is a table showing the driving architectures of the reset-transistor and the barrier transistor when the picture is imaged and not imaged.

DETAILED DESCRIPTION OF THE INVENTION

The first to sixth embodiments of the present invention will be described below with reference to the drawings. In the illustrations of the following drawings, the same or similar reference numbers are given to the same or similar portions. However, attention should be paid to features that, since the drawings are only diagrammatic, the relation between the thickness and the planar dimension, and the ratio between the thicknesses of respective layers, and the like differ from the actual constituent members. Thus, the specific thicknesses and dimensions should be judged by referring to the following explanations. Also, of course, the portions in which the mutual dimensional relations and ratios are different are included even between various drawings.

Also, the following first to sixth embodiments only exemplify the devices and methods that embody the technical idea of the present invention. Also, in the technical idea of the present invention, the materials, shapes, structures, arrangements and the like of configuration parts are not limited to the following items. Various modifications can be applied to the technical idea of the present invention, within the technical scope described in claims.

First Embodiment

Optical Communication System

Figure 1:
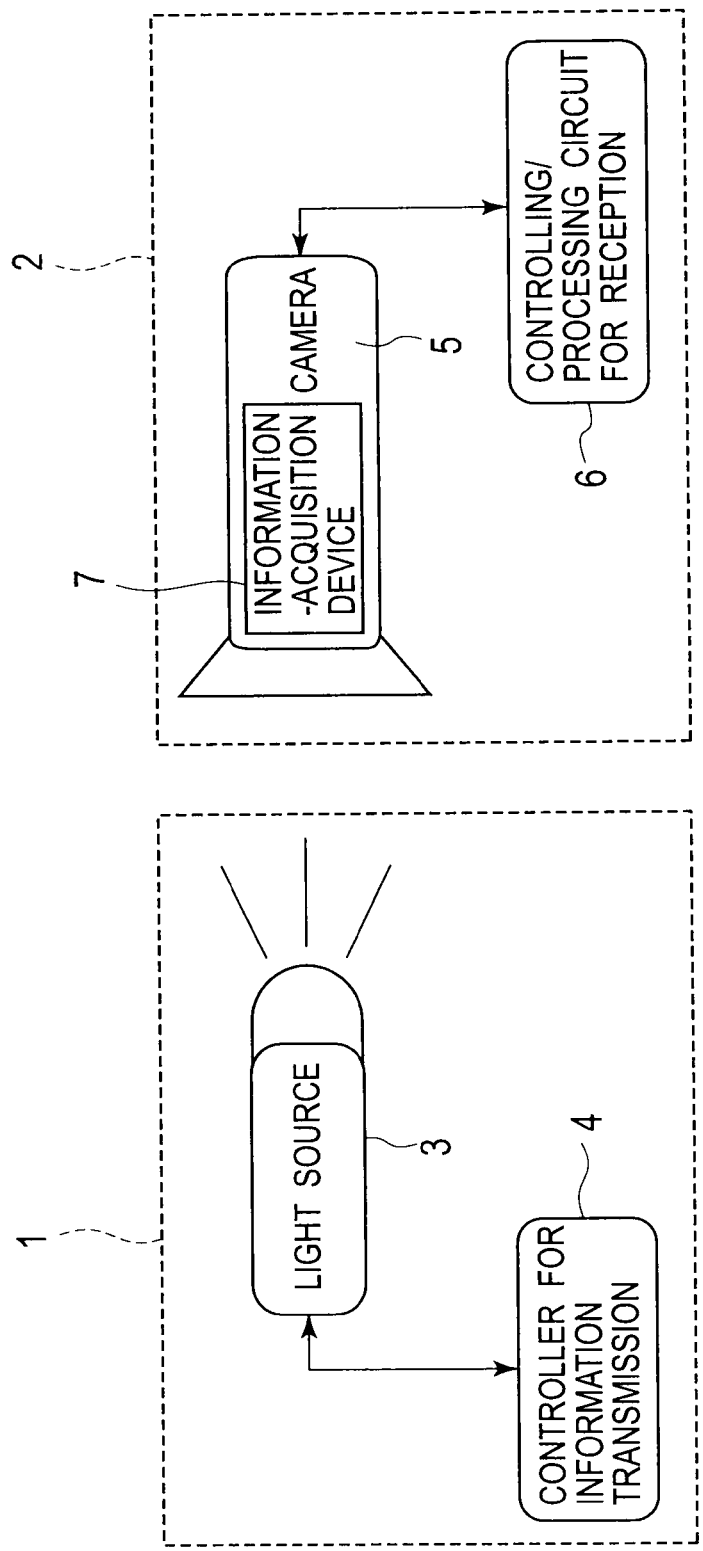
FIG. 1 is a block diagram explaining a configuration of an outline of an optical communication system pertaining to a first embodiment of the present invention.

As shown in FIG. 1, an optical communication system pertaining to a first embodiment of the present invention encompasses an information-transmission unit 1 and an information reception unit 2 configured to acquire both of picture-information and optical-communication signal information from the information-transmission unit 1. Here, the "picture-information" indicates a light intensity, which is an integral value of light confined within an imaging-area with respect to a predetermined period, and the "optical-communication signal information" indicates digital information generated from an optical pulse signal wave. The information-transmission unit 1 encompasses a light source 3 and a controller 4 for information-transmission, configured to control the light source 3. For example, a light emitting diode is used as the light source 3. In accordance with the desired digital information to be transmitted, the controller 4 controls the turning on and off of the light emitting diode so as to transmit the optical communication signal from the light emitting diode.

The information reception unit 2 encompasses a camera 5 and a controlling/processing circuit 6 for reception, configured to control the operation of the camera 5 and then processing the picture-information and the optical-communication signal information that are acquired by the camera 5. An information-acquisition device 7 pertaining to the first embodiment of the present invention is embedded in the camera 5. The information-acquisition device 7 encompasses a CMOS type sensor array included in this camera 5. The feature of the information-acquisition device 7 inheres in a configuration, which can perform both of a function of acquiring a brightness-information (luminance-information) from the light within the imaging-area and a function of acquiring the optical-communication signal information from the optical-communication signal transmitted by the light source 3. By the way, in the information-acquisition device 7, it is also possible to use devices other than the CMOS type sensor array. The controlling/processing circuit 6 executes various processes by using the acquired picture-information and optical-communication signal information. The controlling/processing circuit 6 is mounted in, for example, a personal computer and the like. However, FIG. 1 is the logical block diagram that explains an outline of the information-transmission unit 1 and the information reception unit 2. As the actual hardware configuration, a part of the controlling/processing circuit 6 may be embedded in the camera 5, or the part of the controlling/processing circuit 6 may be monolithically integrated on the same semiconductor chip as the CMOS type sensor array.

Information-Acquisition Device

Figure 2:
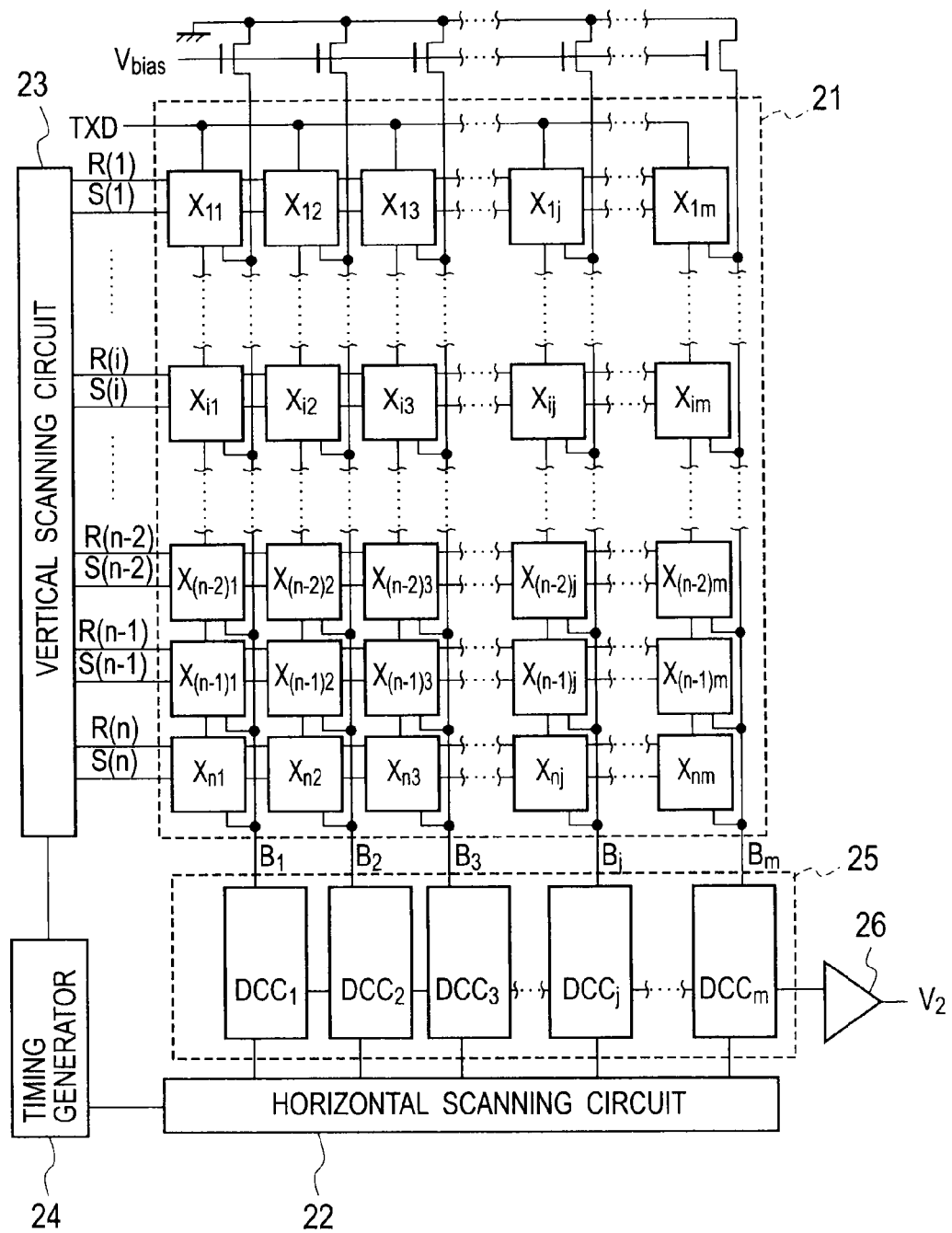
FIG. 2 is a diagrammatic plan view explaining a layout on a semiconductor chip of a CMOS type sensor array as one example of an information-acquisition device that is included by an information reception unit pertaining to the first embodiment of the present invention.

In the information-acquisition device pertaining to the first embodiment of the present invention, as shown in FIG. 2, a sensor array 21 and peripheral circuit portions (22, 23, 24 and $DCC_1$ to $DCC_m$) are integrated on the same semiconductor chip. On the sensor array 21, a large number of cells $X_{ij}$ (i=1 to m; j=1 to n: m and n are integers, respectively) are arrayed in a shape of a two-dimensional matrix, and a rectangular imaging-area is implemented. The cells $X_{ij}$ arrayed in the sensor array 21 correspond to one of a cell configured to acquire the optical-communication signal information, a cell configured to acquire the picture-information, and a cell that can perform both of the function of acquiring the optical-communication signal information and the function of acquiring the picture-information. Then, in the lower side portion of the sensor array 21, a horizontal scanning circuit 22 is provided along directions of cell rows $X_{11}$ to $X_{1m}$; $X_{21}$ to $X_{2m}$; - - - ; $X_{n1}$ to $X_{nm}$, and in the left side portion of the sensor array 21, a vertical scanning circuit (vertical driver circuit) 23 is provided along directions of cell columns $X_{11}$ to $X_{n1}$; $X_{12}$ to $X_{n2}$; - - - ; $X_{1j}$ to $X_{nj}$; - - - ; $X_{1m}$ to $X_{nm}$. A timing generator 24 is connected to the vertical scanning circuit (vertical driver circuit) 23 and the horizontal scanning circuit 22.

The cells $X_{ij}$ in the inside of the sensor array 21 are sequentially scanned by the timing generator 24, the horizontal scanning circuit 22 and the vertical scanning circuit (vertical driver circuit) 23, and reading-out operations of cell signals and global electronic-shutter operations are executed. That is, the information-acquisition device pertaining to the first embodiment of the present invention is configured such that, by vertically scanning the sensor array 21 at respective cell rows $X_{11}$ to $X_{1m}$; $X_{21}$ to $X_{2m}$; . . . ; $X_{n1}$ to $X_{nm}$ units, the cell signals of the respective cell rows $X_{11}$ to $X_{1m}$; $X_{21}$ to $X_{2m}$; - - - ; $X_{n1}$ to $X_{nm}$, the cell signals are read out by vertical output-signal lines $B_1, B_2, B_3$, - - - , $B_j$, - - - , $B_m$ provided to the cell columns $X_{11}$ to $X_{n1}$; $X_{12}$ to $X_{n2}$; - - - ; $X_{1j}$ to $X_{nj}$; - - - ; $X_{1m}$ to $X_{nm}$, respectively. Direct current noise canceling circuits $DCC_1$, $DCC_2$, $DCC_3$, - - - , $DCC_j$, - - - , $DCC_m$ are connected to the vertical output-signal lines $B_1, B_2, B_3$, - - - , $B_j$, - - - , $B_m$, respectively. That is, for each horizontal line, levels based on signal charges are read out to the direct current noise canceling circuits $DCC_1$ to $DCC_m$ of the corresponding columns, respectively, and after the direct current noise canceling circuits $DCC_1$ to $DCC_m$ remove the direct current components, respectively, the horizontal scan is carried out.

Figure 3:
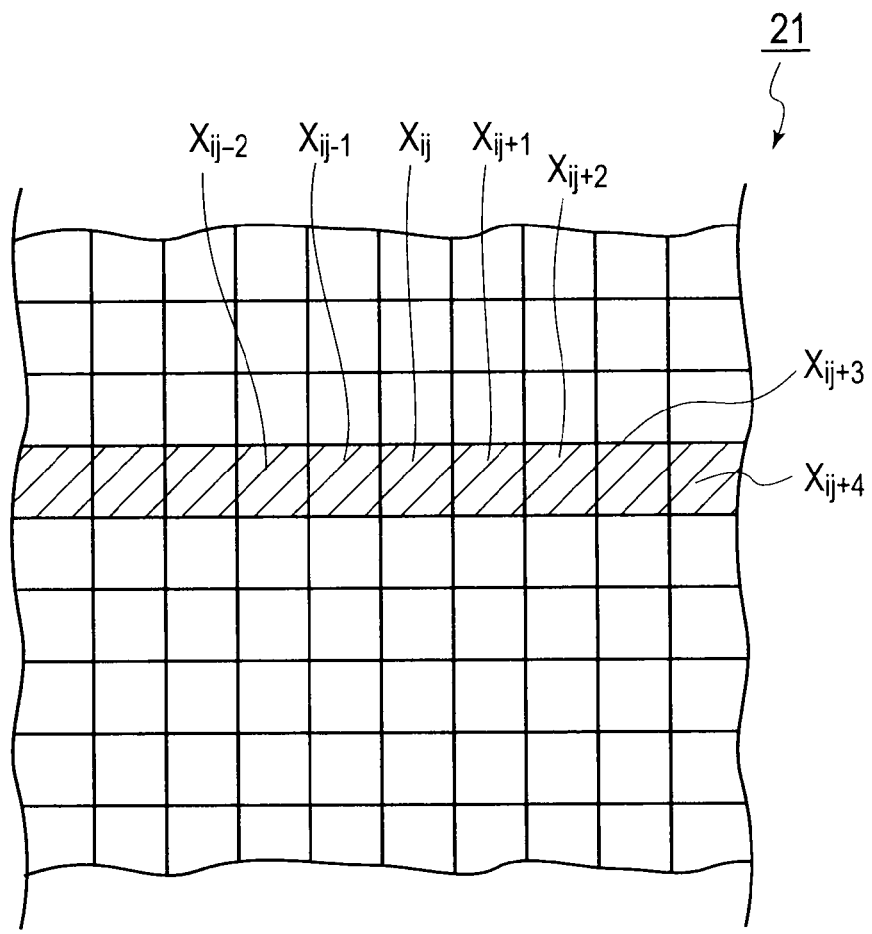
FIG. 3 is a schematic plan view showing an outline of the sensor array of the information-acquisition device pertaining to the first embodiment of the present invention.

For example, as shown in FIG. 3, along the cell rows $X_{i,j-2}$, $X_{i,j-1}$, $X_{i,j}$, $X_{i,j+1}$, $X_{i,j+2}$, $X_{i,j+3}$, - - - that are hatched with oblique lines, the cells each having the function of acquiring the optical-communication signal information are arranged, and the cells each having the function of acquiring the picture-information are arranged along the other cell rows. Or, along the cell rows $X_{i,j-2}$, $X_{i,j-1}$, $X_{i,j}$, $X_{i,j+1}$, $X_{i,j+2}$, $X_{i,j+3}$, - - - that are hatched with the oblique lines, the cells each having both of the function of acquiring the optical-communication signal information and the function of acquiring the picture-information are arranged, and the cells each having the function of acquiring only the picture-information are arranged along the other cell rows. Or, all of the cells may have both of the function of acquiring the optical-communication signal information and the function of acquiring the picture-information.

Figure 4:
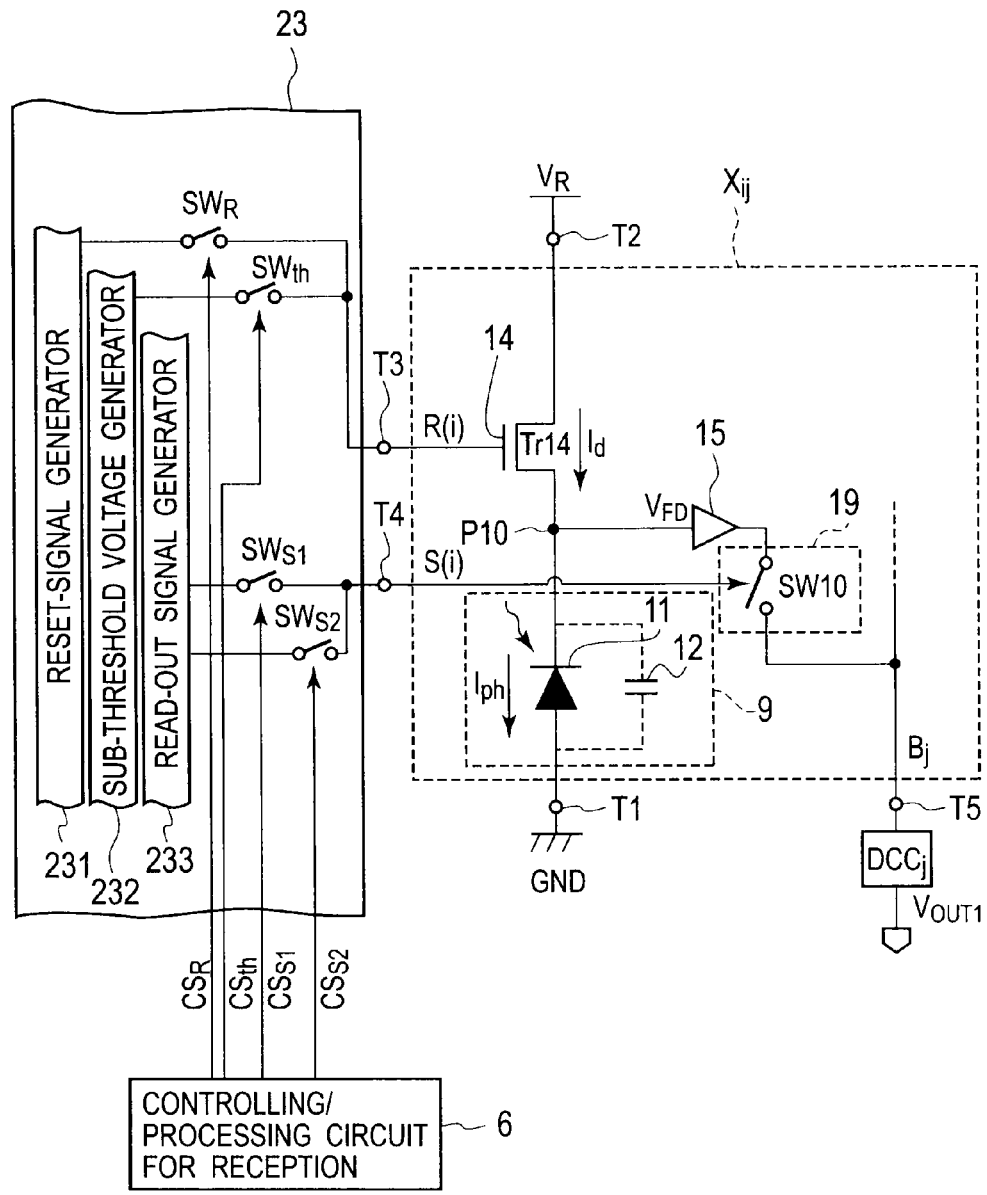
FIG. 4 is a schematic view showing an outline of a circuit configuration of a cell, which implements the sensor array pertaining to the first embodiment of the present invention.

FIG. 4 shows one example of the circuit configuration of the cell $X_{ij}$ in the cell rows $X_{i,j-2}$, $X_{i,j-1}$, $X_{i,j}$, $X_{i,j+1}$, $X_{i,j+2}$, $X_{i,j+3}$, - - -, which has only the function of acquiring the optical-communication signal information, among the plurality of cells arrayed in the sensor array 21 of the information-acquisition device 7 shown in FIG. 2. By the way, each of the circuit configuration of the cell $X_{ij}$ is common to the circuit configuration of the cells having the function of acquiring the picture-information. That is, all of the cells in the inside of the sensor array 21 have the common circuit configuration. Although the details will be described later, a difference between the cell configured to acquire the optical-communication signal information and the cell configured to acquire the picture-information lies in a difference in the driving architecture. Furthermore, the cell configured to acquire the optical-communication signal information differs from the cell configured to acquire the picture-information, even in the configuration in which the direct current noise canceling circuit is connected to the output-signal line.

As shown in FIG. 4, the cell $X_{ij}$ in the information-acquisition device pertaining to the first embodiment encompasses a photoelectric-conversion accumulation element 9 for generating and accumulating the signal charge; a potential detection circuit 14 for detecting the signal charge generated by the photoelectric-conversion accumulation element 9, as a potential change; an amplification circuit 15 for amplifying the potential change and transmitting the potential change to the output-signal line $B_j$; and a selection circuit 19 that is inserted between the amplification circuit 15 and the output-signal line $B_j$ and selects the cell $X_{ij}$ on the particular row in the inside of the sensor array 21. The photoelectric-conversion accumulation element 9 and the potential detection circuit 14 are connected in series between a first potential terminal T1 and a second potential terminal T2. The potential detection circuit 14 has an insulated-gate transistor (reset-transistor) Tr14 for detecting the potential change in a weak inversion state, when the optical-communication signal is supposed to be received. As shown in FIG. 4, the photoelectric-conversion accumulation element 9 has a photodiode 11 for generating the signal charge and a charge-accumulation capacitor 12 that is connected in parallel to the photodiode 11 and accumulates the charges generated by photoelectric conversion. Although the photoelectric-conversion accumulation element 9 shown in FIG. 4 is represented by an equivalent circuit, from a viewpoint of physical structure, the charge-accumulation capacitor 12 may be a capacitive component whose main building block is the junction capacitance of the photodiode 11. The selection circuit 19 has a read-out switch SW10.

When the circuit configuration shown in FIG. 4 is described at a semiconductor element level such as transistors or the like, the photodiode 11 and the reset-transistor Tr14 are connected in series between the first potential terminal T1 and the second potential terminal T2. An anode of the photodiode 11 is connected to the first potential terminal T1, a cathode of the photodiode 11 is connected to a source electrode of the reset-transistor Tr14, and a drain electrode of the reset-transistor Tr14 is connected to the second potential terminal T2. The first potential terminal T1 is connected to a ground potential (the lower-level power supply) GND. The second potential terminal T2 is connected to a reset voltage $V_R$. The reset voltage $V_R$ is a positive fixed potential. A gate electrode of the reset-transistor Tr14 is connected to a first control-signal input terminal T3. The first control-signal input terminal T3 is connected to the vertical scanning circuit 23.

The vertical scanning circuit 23 encompasses a reset-signal generator 231 for transmitting a reset signal in a pulse waveform to the gate electrode of the reset-transistor Tr14; a sub-threshold voltage generator 232 for transmitting a sub-threshold voltage to the gate electrode of the reset-transistor Tr14; and a read-out signal generator 233 for generating a control signal that controls the read-out switch SW10. The reset-signal generator 231 is connected through a reset signal switch $SW_R$ to the first control-signal input terminal T3, and the sub-threshold voltage generator 232 is connected through a sub-threshold voltage switch $SW_{th}$ to the first control-signal input terminal T3. When a gate threshold voltage of the reset-transistor Tr14 is assumed to be $V_{th}$ and when the sub-threshold voltage switch $SW_{th}$ is made conductive, a gate voltage $V_{gs}$ of $V_{gs}<V_{th}$ is applied to the gate of the reset-transistor Tr14 through the first control-signal input terminal T3 from the sub-threshold voltage generator 232. Consequently, the surface of the channel region just under the gate electrode of the reset-transistor Tr14 is made in the weak inversion state, and the reset-transistor Tr14 is operated in a sub-threshold regime.

The read-out signal generator 233 provides a signal transmission route for picture-information when the picture-information, which is connected to a second control-signal input terminal T4, is acquired through a first readout-signal switch $SW_{S1}$, and another signal transmission route for optical-communication signal when the optical-communication signal information, which is connected to the second control-signal input terminal T4, is acquired through a second readout-signal switch $SW_{S2}$, and then, the read-out switch SW10 is connected to the second control-signal input terminal T4. The reset signal switch $SW_R$ is opened/closed by a reset-signal output-control signal $CS_R$ from the controlling/processing circuit 6, the sub-threshold voltage switch $SW_{th}$ is opened/closed by a sub-threshold voltage output-control signal $CS_{th}$ from the controlling/processing circuit 6, the first readout-signal switch $SW_{S1}$ is opened/closed by a first readout-signal output-control signal $CS_{S1}$ from the controlling/processing circuit 6, and the second readout-signal switch $SW_{S2}$ is opened/closed by a second readout-signal output-control signal $CS_{S2}$ from the controlling/processing circuit 6.

By the way, the configuration of the vertical scanning circuit 23 shown in FIG. 4 is only exemplified, and the topology of the vertical scanning circuit 23 is not limited to the configuration shown in FIG. 4. For example, the vertical scanning circuit 23 may embrace a memory for holding the data related to driving architecture of the reset-transistor Tr14 and the read-out switch SW10; and a control circuit for controlling the reset signal switch $SW_R$, the sub-threshold voltage switch $SW_{th}$, the first readout-signal switch $SW_{S1}$ and the second readout-signal switch $SW_{S2}$ in accordance with the data stored in the memory. In this case, the data related to the driving architecture stored in the memory can be sequentially updated, and the control circuit in the vertical scanning circuit 23 can be designed to transmit the control signal for controlling the reset-transistor Tr14 and the read-out switch SW10 in accordance with the data, to the first control-signal input terminal T3 and the second control-signal input terminal T4.

A middle point P10 between the photodiode 11 and the reset-transistor Tr14 is connected, through the amplification circuit 15 and the read-out switch SW10, to the vertical output-signal line $B_j$. The amplification circuit 15 and the read-out switch SW10 are connected in series between the middle point P10 and the output-signal line $B_j$. The output-signal line $B_j$ is connected to an output-signal terminal T5. The output-signal terminal T5 is connected to the direct current noise canceling circuit $DCC_j$. The direct current noise canceling circuit $DCC_j$ has an analog/digital conversion circuit. Then, the optical-communication signal information acquired by the cell $X_{ij}$ is converted into a digital signal by the analog/digital conversion circuit and provided to an output $V_{OUT1}$.

Figure 5:
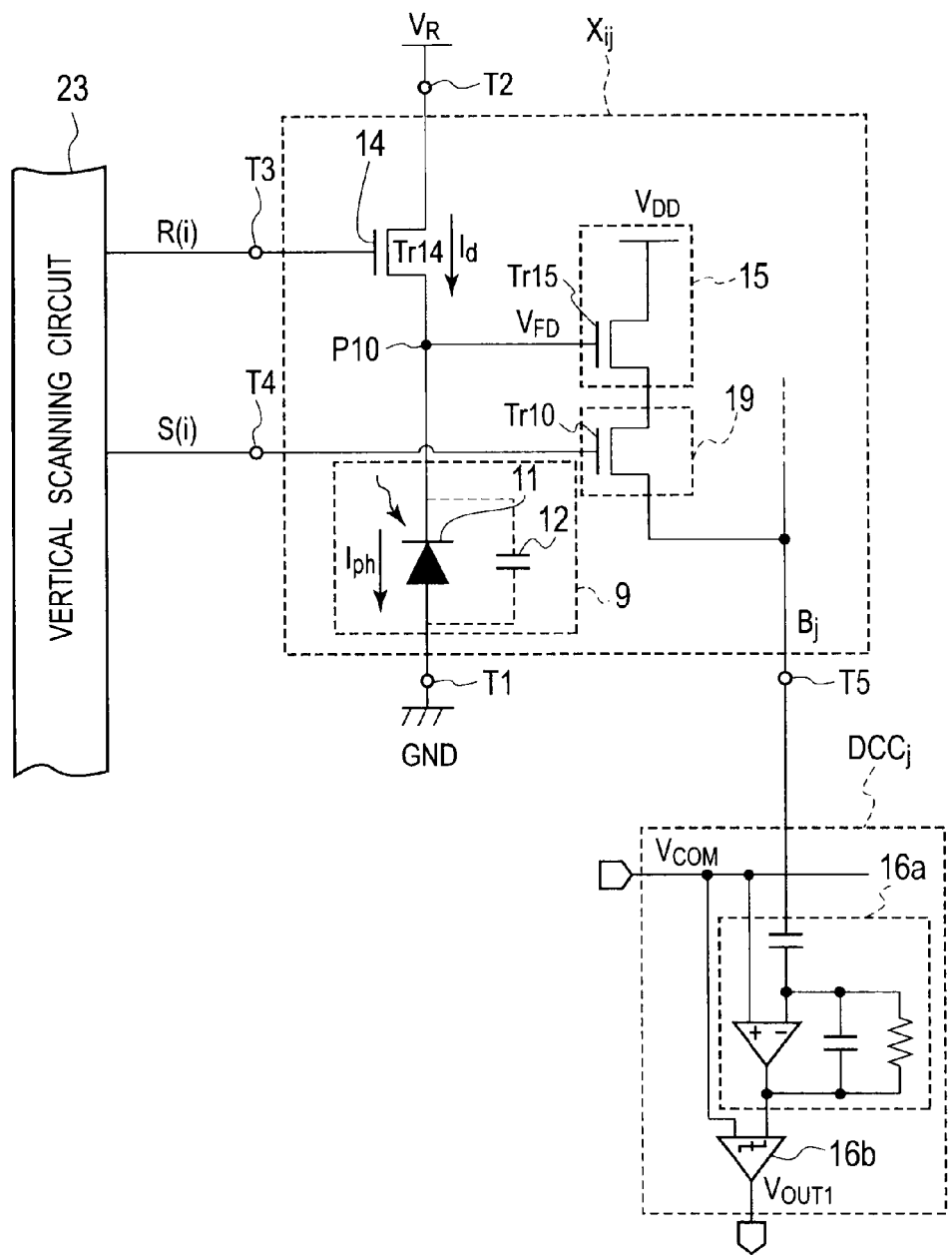
FIG. 5 is a view showing the specific circuit configuration of the cell according to FIG. 4.

FIG. 5 shows one example of specific circuit configurations of the cell $X_{ij}$ and the direct current noise canceling circuit $DCC_j$. As shown in FIG. 5, the amplification circuit 15 encompasses a buffer transistor Tr15 so as to implement a source follower circuit. The selection circuit 19, which was represented by the read-out switch SW10 in FIG. 4, embraces a read-out transistor Tr10. A gate electrode of the buffer transistor Tr15 is connected to a cathode of the photodiode 11, a drain electrode of the buffer transistor Tr15 is connected to a higher-level power supply $V_{DD}$, and a source electrode of the buffer transistor Tr15 is connected to the read-out transistor Tr10. A gate electrode of the read-out transistor Tr10 is connected to the second control-signal input terminal T4, a drain electrode of the read-out transistor Tr10 is connected to the amplification circuit 15, and a source electrode of the read-out transistor Tr10 is connected to the output-signal line $B_j$.

The direct current noise canceling circuit $DCC_j$ encompasses a band path filter circuit 16a and a comparator circuit 16b (as one example of the analog/digital conversion circuit). A reference voltage $V_{COM}$ is fed to the band path filter circuit 16a and the comparator circuit 16b. In the band path filter circuit 16a, a cutoff frequency is elected so as to pass frequencies around a carrier frequency of the optical-communication signal. Consequently, the direct current component can be removed from the optical-communication signal, and noise components except the optical-communication signal can be also removed. The comparator circuit 16b makes the signal components passed through the band path filter circuit 16a into pulses, and restores the optical-communication signal into the digital information. By the way, as for the circuit configurations related to the amplification circuit 15, the selection circuit 19 and the direct current noise canceling circuit $DCC_j$, the other circuit topologies can be used instead of the circuit configuration exemplified in FIG. 5.

FIG. 6(a) shows a driving architecture of the reset-transistor Tr14 and the read-out transistor Tr10 when the optical-communication signal is received and not received, in the cell $X_{ij}$ configured to acquire the optical-communication signal information. For comparison, FIG. 6(b) shows the driving architecture of another reset-transistor Tr14 and another read-out transistor Tr10, when the picture is imaged and not imaged, in another cell configured to acquire picture-information, in the inside of the sensor array 21.

At first, as shown in FIG. 5, the cell configured to acquire the picture-information is explained, under assumption that the reset-transistor Tr14 and the read-out transistor Tr10 are implemented by nMOSFETs. As shown in FIG. 6(b), when the picture is imaged, in order to initialize the charge quantity of the charge-accumulation capacitor 12, a voltage of a high level (an ON-signal) is transferred as a reset signal in a pulse waveform to the gate electrode of the reset-transistor Tr14, and the reset-transistor Tr14 is turned on. The reset-transistor Tr14 is controlled in off state because a voltage of a low level (an OFF-signal) is transferred as the reset signal in pulse waveform after the initialization. The read-out transistor Tr10 is controlled by a read-out signal in a pulse waveform so that the read-out transistor Tr10 is turned off when a voltage at low level (the OFF-signal) is applied in the charge accumulation period, and the read-out transistor Tr10 is turned on when a voltage at high level (the ON-signal) is applied in the charge transfer period. When the light is irradiated to the cell $X_{ij}$ in the charge accumulation period, the charges are generated in the photodiode 11. When the generated charges are accumulated in the charge-accumulation capacitor 12, the input voltage $V_{FD}$ of the amplification circuit 15 is decreased. When the read-out transistor Tr10 is turned on after the elapse of a predetermined period, the input voltage $V_{FD}$ (or an amplification voltage based on the input voltage $V_{FD}$) is transferred through the amplification circuit 15 to the output-signal line $B_j$. In the cell $X_{ij}$ acquiring the picture-information, the output-signal line $B_j$ is connected to picture-information processing circuit in the controlling/processing circuit 6 (please see FIG. 1). With the picture-information processing circuit, the cell being supposed to acquire the picture-information can acquire the picture-information. When the picture is not imaged, both of the reset-transistor Tr14 and the read-out transistor Tr10 are controlled to be in off state when a voltage at low level (the OFF-signal) is applied.

On the other hand, as shown in FIG. 6(a), the cell $X_{ij}$, being supposed to acquire the optical-communication signal information, is driven by a different driving scheme, which is clearly distinguishable from the driving scheme of the cell being supposed to acquire the picture-information. When the optical-communication signal is supposed to be received, both of the reset-transistor Tr14 and the read-out transistor Tr10 are controlled to be in on state. When the optical-communication signal is not received, both of the reset-transistor Tr14 and the read-out transistor Tr10 are controlled to be in off state.

Figure 7:
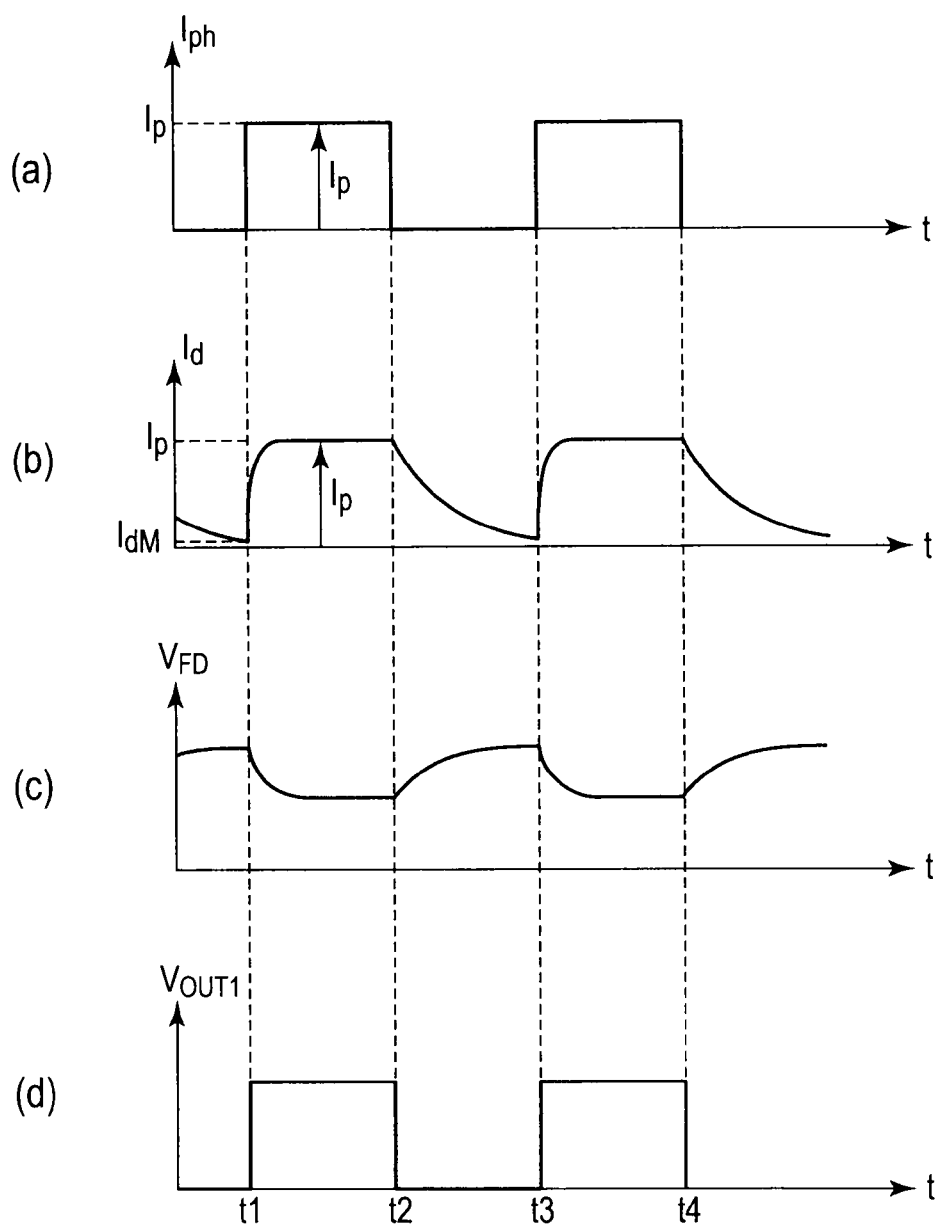
FIGS. 7($a$) to ($d$) are views showing operational waveforms of the cell, when the optical-communication signal is supposed to be received by the sensor array in the information-acquisition device pertaining to the first embodiment of the present invention.

FIGS. 7(a) to (d) show various operational waveforms when the optical-communication signal is received. FIG. 7(a) shows a photodiode current $I_{ph}$ that is varied in response to the optical-communication signal transferred to the cell $X_{ij}$ when the photodiode 11 is assumed to be in a non-load state, FIG. 7(b) shows a drain current $I_d$ that flows through the reset-transistor Tr14 connected to the photodiode 11, FIG. 7(c) shows the input voltage $V_{FD}$ of the amplification circuit 15, and FIG. 7(d) shows the output $V_{OUT1}$ after the conversion in the analog/digital conversion circuit 16.

As shown in FIG. 7(a), when the photodiode 11 is in the non-load state, the photodiode current $I_{ph}$ repeats the high and low levels, in response to the optical-communication signal. When the optical-communication signal is changed from the low level to the high level, at timings t1 and t3, the charges are generated in the photodiode 11, and the photodiode current $I_{ph}$ is changed from the low level to the high level. The cell $X_{ij}$ being supposed to acquire the optical-communication signal information is set such that the gate voltage $V_{gs}$ of $V_{gs} < V_{th}$ is applied to the gate of the reset-transistor Tr14 connected to the photodiode 11, through the sub-threshold voltage switch $SW_{th}$ from the sub-threshold voltage generator 232, and a diffusion current flows in the weak inversion state. Thus, as shown in FIG. 7(b), the drain current $I_d$ flows in response to the photodiode current $I_{ph}$. In the sub-threshold regime of $V_{gs} < V_{th}$, since the drain current of the reset-transistor Tr14 is very small, the charges generated in the photodiode 11 are accumulated in the charge-accumulation capacitor 12. Consequently, the potential of the source electrode of the reset-transistor Tr14 is decreased. The drain current $I_d$ of the reset-transistor Tr14 in the sub-threshold regime is represented by the following Eq. (1).

$$I_d = I_{so} \exp(qV_{gs}/nkT)\{1 - \exp(-qV_{ds}/kT)\} \quad (1)$$

Here, $I_{so}$ is a constant based on a structure, q is the elementary charge of the electron, k is the Boltzmann constant, T is the absolute temperature, and n is the ideality factor. Since a source-drain voltage $V_{ds}$ of the reset-transistor Tr14 is represented by $V_{ds} \gg V_T$ with $kT/q = V_T$ as the thermal resistance, Eq. (1) is represented by the following Eq. (2).

$$I_d = I_{so} \exp(qV_{gs}/nkT) \qquad (2)$$

Actually, a time constant $\tau = RC$ resulting from a resistive component R and a capacitive component C exists between the first potential terminal T1 and the second potential terminal T2. An operational resistance $R_{OP}$ in the weak inversion state of the reset-transistor Tr14 is represented by the following Eq. (3) when Eq. (2) is differentiated with respect to the gate-source voltage $V_{ds}$.

$$R_{OP} = nV_T/I_p \qquad (3)$$

When the other inner resistive components such as the bulk resistance of the reset-transistor Tr14 and the like are ignored, the time constant $\tau$ between the first potential terminal T1 and the second potential terminal T2 is represented by the following Eq. (4) when a parasitic capacitance of interconnections at the input side of the amplification circuit 15 is defined as $C_{FD}$.

$$\tau = nC_{FD}V_T/I_p \qquad (4)$$

Thus, the value of the drain current $I_d$ rises up in a leading-edge characteristic shown in FIG. 7(b). That is, the value of the drain current $I_d$ when the photodiode current $I_{ph}$ is at the high level can be represented by the following Eq. (5).

$$I_d = I_p/\{1 + (I_p/I_{dM} - 1)\exp(-t/\tau)\} \qquad (5)$$

As shown in FIGS. 7(a) and (b), the $I_p$ indicates the maximum values of the drain current $I_d$ and the photodiode current $I_{ph}$, and the $I_{dM}$ indicates the minimum value of the drain current $I_d$. When the drain current $I_d$ flows in response to the decrease in the potential of the source electrode of the reset-transistor Tr14, the voltage drop corresponding to the inner resistance in the sub-threshold regime of the reset-transistor Tr14 causes the input voltage $V_{FD}$ of the amplification circuit 15 to be varied as shown in FIG. 7(c).

At timings t2 and t4, when the optical-communication signal is changed from the high level to the low level, the generation of the charges is stopped in the photodiode 11. However, the reset-transistor Tr14 is set to the weak inversion state. Thus, as shown in FIG. 7(b), the drain current $I_d$ continues to flow toward the charge-accumulation capacitor 12, while the drain current $I_d$ is attenuated on the basis of the time constant $\tau$. That is, the value of the drain current $I_d$ when the photodiode current $I_{ph}$ is at the low level can be represented by the following Eq. (6).

$$I_d = (I_p - I_{dM})\exp(-t/\tau) + I_{dM} \qquad (6)$$

Under the condition of $I_p \gg I_{dM}$ and $t \gg \tau$, Eq. (6) can be approximated by the following Eq. (7).

$$I_d = I_p/(1 + t/\tau) \qquad (7)$$

That is, the charges accumulated in the charge-accumulation capacitor 12 are discharged through the reset-transistor Tr14 on the basis of the time constant $\tau$. Then, the input voltage $V_{FD}$ of the amplification circuit 15 is increased as shown in FIG. 7(c). Consequently, the instantaneous value of the input voltage $V_{FD}$ of the amplification circuit 15 rises and falls as a pulse waveform in response to the change in the photodiode current $I_{ph}$, which varies between the low level and the high level. The pulsating input voltage $V_{FD}$ of the amplification circuit 15 is read out through the amplification circuit 15 to the output-signal line $B_j$. The direct current noise canceling circuit DCC$_j$ generates the digital signal corresponding to the pulsating input voltage $V_{FD}$, as shown in FIG. 7(d). The digital signal shown in FIG. 7(d) indicates the variation corresponding to the optical-communication signal. In this way, the cell $X_{ij}$ can acquire the optical-communication signal information.

As indicated in Eqs. (4) to (7), it can be understood that, when the parasitic capacitance $C_{FD}$ is sufficiently decreased, a transient response of high speed can be achieved for minute optical-current amplitude $I_p$. For example, when the parasitic capacitance $C_{FD}$ is assumed to be 2.5 pF and the amplitude $I_p$ is assumed to be 100 pA, the time constant $\tau$ at normal temperature (27° C.) is 0.65 μs. When ten times of the time constant is assumed to be the pulse period of the optical-communication signal, the communication can be carried out at a bit rate of 100 kHz or more.

Figure 8:
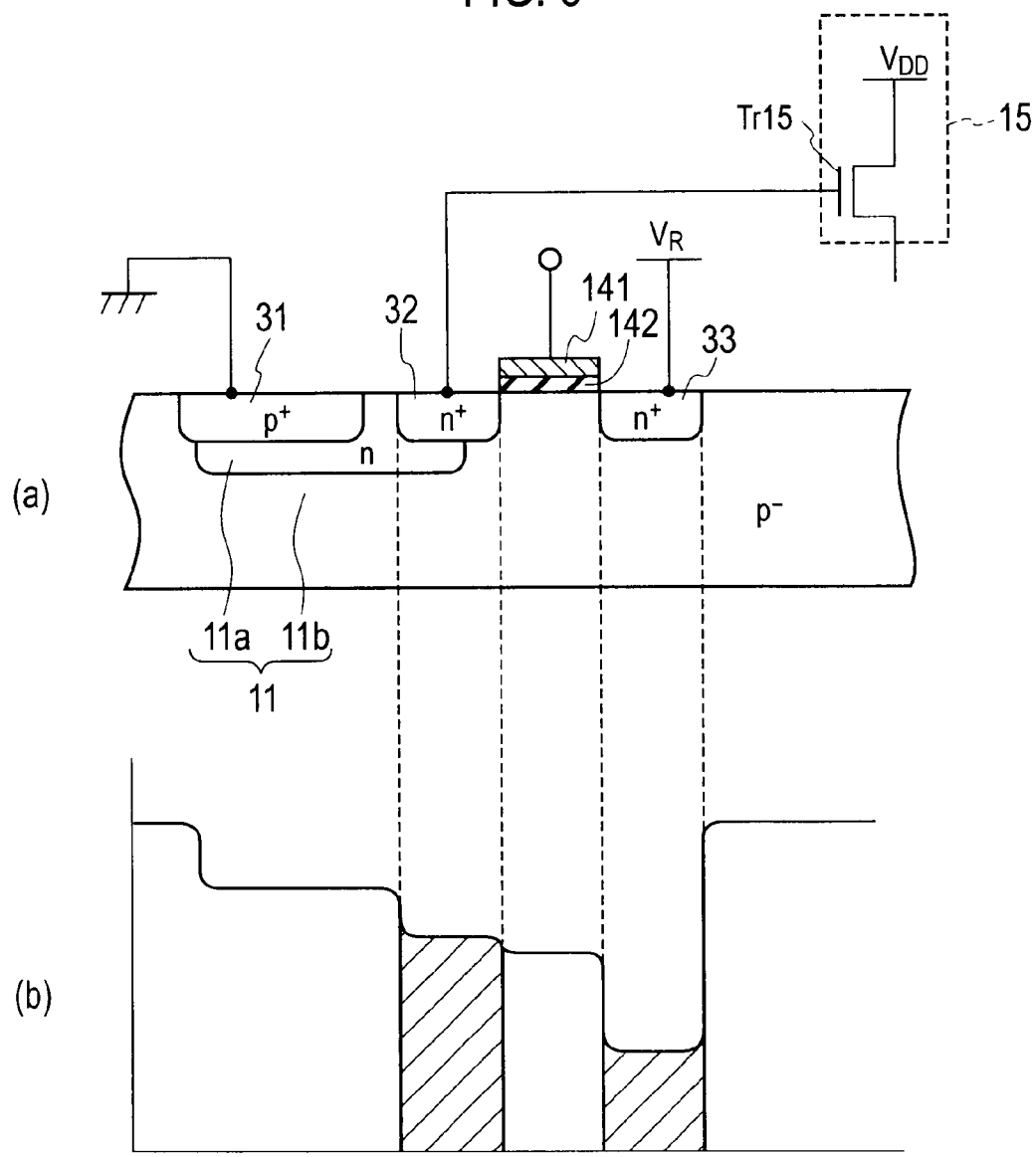
FIG. 8($a$) is a cross-sectional view explaining an outline of the structure of the cell in the sensor array in the information-acquisition device pertaining to the first embodiment of the present invention, and FIG. 8($b$) is a diagrammatic view showing a potential level of a conduction band on a surface of a p-type semiconductor substrate.

As shown in FIG. 8(a), the cell $X_{ij}$, which is arrayed in the sensor array 21 pertaining to the first embodiment of the present invention encompasses a semiconductor layer 11b of a first conductivity type (p-type) and a surface-buried region 11a of a second conductivity type (n-type) arranged on the semiconductor layer 11b. The surface-buried region 11a serves as a light-reception cathode region (a charge-generation region), and the semiconductor layer 11b just under the surface-buried region (the light-reception cathode region) 11a serves as a light-reception anode region. Consequently, the surface-buried region 11a and the semiconductor layer 11b implement the photodiode 11. A pinning layer 31 of a first conductivity type (p$^+$-type) connected to the ground potential (the lower-level power supply) GND and a charge-accumulation region 32 of a second conductivity type (n$^+$-type) serving as a floating-diffusion region are arranged above the surface-buried region (the light-reception cathode region) 11a. The pinning layer 31 is a layer for suppressing the carriers from being generated on the surface at a dark time, and the pinning layer 31 is used as the layer preferable for decreasing a dark current. In an intended end-usage (application field) in which the dark current is not problematic and the like, the pinning layer 31 may be structurally omitted. Also, instead of using the semiconductor substrate 11b as "the semiconductor region of first conductivity type", a double-layer structure encompassing a semiconductor substrate of the first conductivity type (p$^+$-type), in which an impurity concentration is about $4 \times 10^{17}$ cm$^{-3}$ or more and about $1 \times 10^{21}$ cm$^{-3}$ or less, and an epitaxial growth layer of the first conductivity type (p-type), which is arranged on the semiconductor substrate, having an impurity concentration lower than that of the semiconductor substrate, is formed, and then, the epitaxial growth layer of the first conductivity type may be employed as "the semiconductor region of first conductivity type".

Then, as shown on the right side of FIG. 8(a), a reset drain region 33 of the second conductivity type (n$^+$-type) in the reset-transistor Tr14 is arranged on the surface of the semiconductor layer 11b of the first conductivity type, separately from the charge-accumulation region 32. The charge-accumulation region 32 also serves as a rest source region of the reset-transistor Tr14. A gate insulation film 142 is formed on the semiconductor layer 11b. As the gate insulation film 142, a silicon oxide film (SiO$_2$ film) is preferable. However, any insulation gate structures of insulated-gate transistors (MIS transistors) that use various insulation films other than the silicon oxide film (SiO$_2$ film) can be used. For example, the gate insulation film 142 may be an ONO film implemented by a triple-level lamination film of a silicon oxide film (SiO$_2$ film)/a silicon nitride film (Si$_3$N$_4$ film)/a silicon oxide film (SiO$_2$ film). Moreover, the oxidative product containing at least one element of strontium (Sr), aluminum (Al), magnesium (Mg), yttrium (Y), hafnium (Hf), zirconium (Zr), tantalum (Ta) and bismuth (Bi), or the silicon nitride containing those elements or the like can be used as the gate insulation film 142. A reset gate electrode 141 is arranged on the gate insulation film 142. Then, the charge-accumulation region 32, the reset gate electrode 141 and the reset drain region 33 implement the nMOSFET as the reset-transistor Tr14.

As shown in FIG. 8(a), the gate electrode of the buffer transistor Tr15 implementing the amplification circuit 15 is connected to the charge-accumulation region 32. A drain electrode of the buffer transistor Tr15 is connected to the higher-level power supply $V_{DD}$, and a source electrode is connected to the drain electrode of the read-out transistor Tr10 (please see FIG. 5). In the sectional structure shown in FIG. 8(a), the usual CMOS process can be used when the semiconductor layer 11b is assumed to be the semiconductor substrate in which the impurity concentration is about $6 \times 10^{11}$ $cm^{-3}$ or more and about $2 \times 10^{15}$ $cm^{-3}$ or less.

FIG. 8(b) shows the potential levels of the conduction bands in the surface of the semiconductor layer 11b, when a voltage at high level is applied to the reset gate electrode 141 so that the reset-transistor Tr14 is being kept in the on state. The carriers (electrons) generated in the charge-generation region (the light-reception anode region) are injected into the charge-accumulation region 32, which is buried in a part of the surface-buried region 11a just on the charge-generation region and having a lower potential level than the surface-buried region 11a. Since the impurity concentration of the surface-buried region 11a is set to be lower than the impurity concentration of the charge-accumulation region 32, the photodiode 11 can be operated at a fully depleted potential, and the value of a capacitance can be made irrelevant of the response in the charge-accumulation region 32, and the parasitic capacitance $C_{FD}$ can be made small. For this reason, while obtaining a sufficient occupation area for the photodiode 11, it is possible to response to the optical-communication signal at a high speed.

According to the information-acquisition device pertaining to the first embodiment of the present invention, because the reset-transistor Tr14 is so designed that the reset-transistor Tr14 operates in the weak inversion state when the optical-communication signal is received, even when the very weak optical-communication signal is received, the drain current $I_d$ flowing through the reset-transistor Tr14 is amplified to a large value, and because the input voltage $V_{FD}$ to the amplification circuit 15 is increased, the optical-communication signal can be detected at a higher sensitivity. Also, the information-acquisition device pertaining to the first embodiment does not use the current amplification circuit used in the earlier technique, it is possible to miniaturize the element occupation area, to reduce the electric power consumption and to suppress the noise. Especially, in the miniaturized structure, it is possible to provide the information-acquisition device that can acquire both of the picture-information and the optical-communication signal information, and that can process both of the picture-information and the optical-communication signal information.

Moreover, according to the information-acquisition device pertaining to the first embodiment of the present invention, by assembling the information-transmission unit that transmits the optical-communication signal with the information reception unit that has the information-acquisition device pertaining to the first embodiment, it is possible to provide an optical communication system of a high sensitivity, having a miniaturized shape with a smaller electric power consumption and a lower noise.

Second Embodiment

Although the illustration is omitted, an optical communication system pertaining to a second embodiment of the present invention encompasses an information-transmission unit 1 and an information reception unit 2 configured to acquire both of the picture-information and the optical-communication signal information from the information-transmission unit 1, similarly to the block diagram shown in FIG. 1, and an information-acquisition device 7 embedded in the camera 5 in the information reception unit 2 can perform both of the function of acquiring the picture-information and the optical-communication signal information from the optical-communication signal. Moreover, in the information-acquisition device pertaining to the second embodiment of the present invention, similarly to the configuration shown in FIG. 2, as one example, the sensor array 21 and the peripheral circuit (22, 23, 24 and $DCC_1$ to $DCC_m$) can be integrated on the same semiconductor chip. However, the structure of the cell $X_{ij}$(i=1 to m; j=1 to n: m and n are the integers, respectively) implementing the sensor array 21 differs from the information-acquisition device 7 pertaining to the first embodiment, as shown in FIG. 9.

When a channel length of MOSFET becomes short, a semiconductor surface is easily inverted. Thus, in the case of the nMOSFET, a gate threshold voltage is gradually shifted in a negative direction, and it becomes gradually difficult to control the sub-threshold voltage. As shown in FIG. 9, the cell $X_{ij}$ in the information-acquisition device pertaining to the second embodiment encompasses a photoelectric-conversion accumulation element 9 for generating and accumulating the signal charge; a potential detection circuit 14 for detecting the signal charge generated by the photoelectric-conversion accumulation element 9 as the potential change; an amplification circuit 15 for amplifying the potential change and transmitting the potential change to the output-signal line $B_j$; and a selection circuit 19 inserted between the amplification circuit 15 and the output-signal line configured to select a cell $X_{ij}$ on a particular row in the inside of the sensor array 21. The photoelectric-conversion accumulation element 9 and the potential detection circuit 14 are connected in series between the first potential terminal T1 and the second potential terminal T2. The potential detection circuit 14 has a pMOSFET for detecting the potential change in the weak inversion state, as the reset-transistor Tr14, when the optical-communication signal is supposed to be received. On the other hand, the amplification circuit 15 has an nMOSFET as a buffer transistor Tr15, and the selection circuit 19 has an nMOSFET as a read-out transistor Tr10. As shown in FIG. 9, the photoelectric-conversion accumulation element 9 has a photodiode 11 for generating the signal charge and a charge-accumulation capacitor 12 that is connected in parallel to the photodiode 11 and accumulates the charges generated by the photoelectric conversion. As explained in the first embodiment, the photoelectric-conversion accumulation element 9 shown in FIG. 9 is represented by the equivalent circuit, and from the viewpoint of the physical structure, the charge-accumulation capacitor 12 is a capacitive component whose main building block is the junction capacitance of the photodiode 11.

Figure 9:
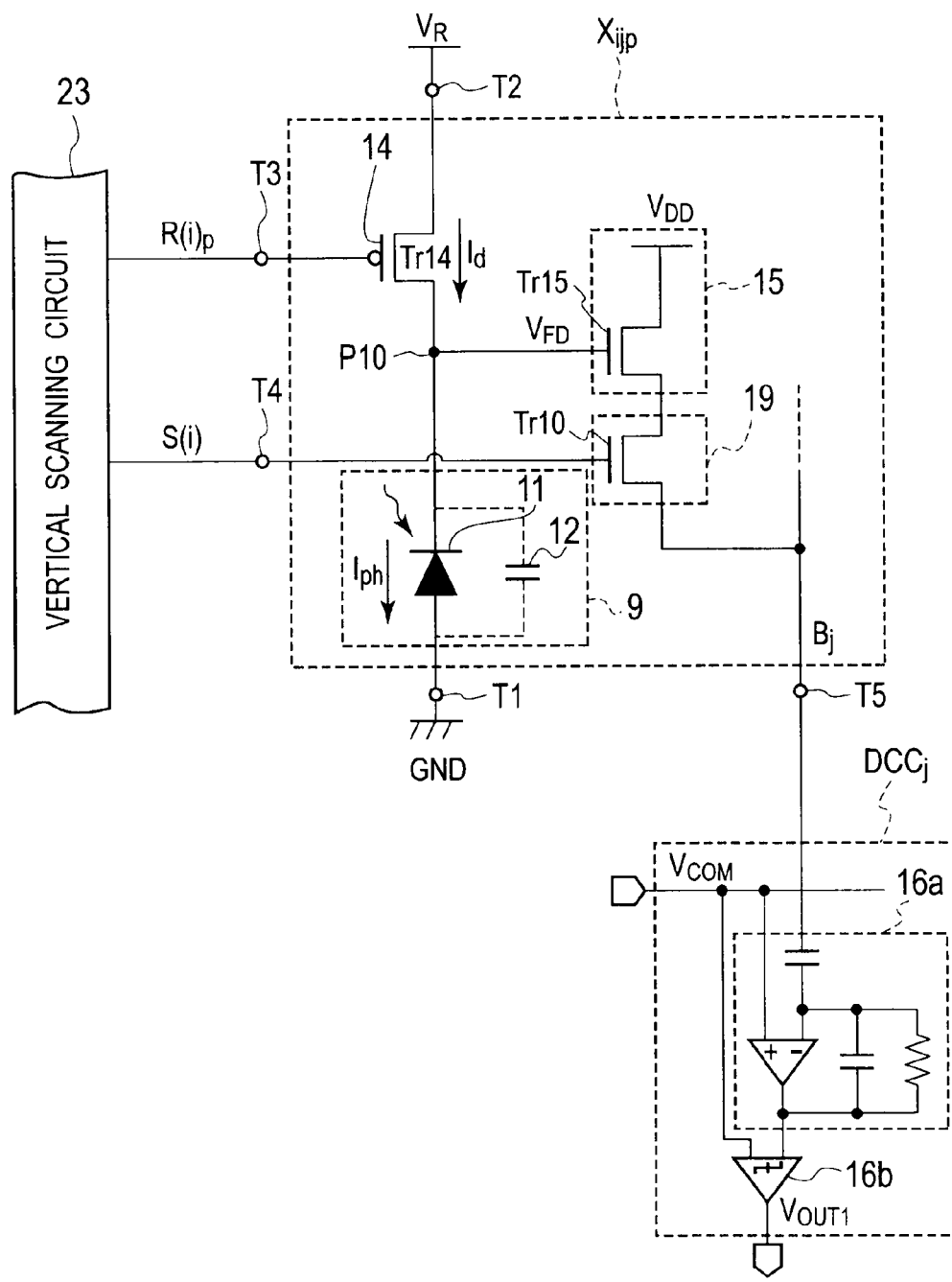
FIG. 9 is a view showing a specific circuit configuration of a cell, which implements a sensor array pertaining to a second embodiment of the present invention.

When the circuit configuration shown in FIG. 9 is described by the semiconductor element level of transistors or the like, a cell $X_{ij}$ configured to implement the sensor array 21 in the information-acquisition device pertaining to the second embodiment encompasses a reset-transistor Tr14 formed of pMOSFET in which the drain electrode is connected through the second potential terminal T2 to the reset voltage $V_R$ and also the gate electrode is connected to the first control-signal input terminal T3; a photodiode 11 in which the cathode is connected to the source electrode of the reset-transistor Tr14 and also the anode is connected through the first potential terminal T1 to the ground potential (the lower-level power supply) GND; a buffer transistor Tr15 formed of nMOSFET in which the potential of the middle point P10 between the photodiode 11 and the reset-transistor Tr14 is applied to the gate electrode and also the drain electrode is connected to the higher-level power supply $V_{DD}$; and a read-out transistor Tr10 formed of nMOSFET in which the drain electrode is connected to the source electrode of the buffer transistor Tr15, the gate electrode is connected to the second control-signal input terminal T4, and also the source electrode is connected to the output-signal line $B_j$. Since the circuit configuration of the direct current noise canceling circuit $DCC_j$ connected to the output-signal line $B_j$ is similar to the information-acquisition device pertaining to the first embodiment, the duplicated explanation is omitted.

Although the illustration of the detailed structure is omitted, similarly to the configuration shown in FIG. 4, the vertical scanning circuit 23 encompasses a reset-signal generator 231 for transmitting the reset signal in pulse waveform to the gate electrode of the reset-transistor Tr14; a sub-threshold voltage generator 232 for transmitting the sub-threshold voltage to the gate electrode of the reset-transistor Tr14; and a read-out signal generator 233 for generating the control signal that controls the read-out transistor Tr10. The reset-signal generator 231 is connected through the reset signal switch $SW_R$ to the first control-signal input terminal T3, and the sub-threshold voltage generator 232 is connected through the sub-threshold voltage switch $SW_{th}$ to the first control-signal input terminal T3. When the gate threshold voltage of the reset-transistor Tr14 is assumed to be $V_{th}$ and when the sub-threshold voltage switch $SW_{th}$ is made conductive, the gate voltage $V_{gs}$ of $V_{gs} < V_{th}$ is applied to the gate of the reset-transistor Tr14 through the first control-signal input terminal T3 from the sub-threshold voltage generator 232. Consequently, the reset-transistor Tr14 is operated in the sub-threshold regime. The read-out signal generator 233 provides a signal transmission route when the picture-information connected to the second control-signal input terminal T4 through the first readout-signal switch $SW_{S1}$ is acquired, and another signal transmission route when the optical-communication signal information connected to the second control-signal input terminal T4 through the second readout-signal switch $SW_{S2}$ is acquired, and a read-out transistor Tr10 is connected to the second control-signal input terminal T4. The reset signal switch $SW_R$ is opened/closed by the reset-signal output-control signal $CS_R$ from the controlling/processing circuit 6, the sub-threshold voltage switch $SW_{th}$ is opened/closed by the sub-threshold voltage output-control signal $CS_{th}$ from the controlling/processing circuit 6, the first read-out-signal switch $SW_{S1}$ is opened/closed by the first readout-signal output-control signal $CS_{S1}$ from the controlling/processing circuit 6, and the second readout-signal switch $SW_{S2}$ is opened/closed by the second readout-signal output-control signal $CS_{S2}$ from the controlling/processing circuit 6.

In the structure of the cell $X_{ij}$ shown in FIG. 9, when the picture is imaged, in order to initialize the charge quantity of the charge-accumulation capacitor 12, the voltage at low level (the ON-signal) is transferred as the reset signal in pulse waveform to the gate electrode of the reset-transistor Tr14, and the reset-transistor Tr14 is turned on. The reset-transistor Tr14 is controlled in off state because the voltage at high level (the OFF-signal) is transferred as the reset signal in pulse waveform to the gate electrode after the initialization. The read-out transistor Tr10 formed of nMOSFET is controlled by the read-out signal in pulse waveform so that the read-out transistor Tr10 is turned off when a voltage at low level (the OFF-signal) is applied to the gate electrode of the read-out transistor Tr10 in the charge accumulation period and read-out transistor Tr10 is turned on when a voltage at high level (the ON-signal) is applied to the gate electrode of the read-out transistor Tr10 in the charge transfer period. When in the charge accumulation period, the charges generated in the photodiode 11 are accumulated in the charge-accumulation capacitor 12, the input voltage $V_{FD}$ of the amplification circuit 15 is decreased. When the read-out transistor Tr10 is turned on after the elapse of a predetermined period, the input voltage $V_{FD}$ (or the amplification voltage based on the input voltage $V_{FD}$) is transferred through the amplification circuit 15 to the output-signal line $B_j$. When the picture is not imaged, because the voltage at high level (the OFF-signal) is applied to the gate electrode of the reset-transistor Tr14, and the voltage at low level (the OFF-signal) is applied to the gate electrode of the read-out transistor Tr10, the reset-transistor Tr14 and the read-out transistor Tr10 are controlled to be in off state.

Similarly to the waveform shown in FIG. 7(a), when the optical-communication signal is changed from the low level to the high level at the timings t1 and t3, the charges are generated in the photodiode 11, and the photodiode current $I_{ph}$ is also changed from the low level to the high level. When the gate voltage $V_{gs}$ of $V_{gs} < V_{th}$ is applied to the gate of the reset-transistor Tr14 through the sub-threshold voltage switch $SW_{th}$ from the sub-threshold voltage generator 232, the reset-transistor Tr14 becomes in the weak inversion state, and the charges generated in the photodiode 11 are accumulated in the charge-accumulation capacitor 12. Consequently, the potential of the source electrode of the reset-transistor Tr14 is decreased. When the drain current $I_d$ flows in response to the drop in the potential of the source electrode of the reset-transistor Tr14, the voltage drop corresponding to the inner resistance in the sub-threshold regime in the reset-transistor Tr14 causes the input voltage $V_{FD}$ of the amplification circuit 15 to be also varied similarly to the waveform shown in FIG. 7(c).

At the timings t2 and t4, when the optical-communication signal is changed from the high level to the low level, the generation of the charges is stopped in the photodiode 11. However, because the reset-transistor Tr14 is set to the weak inversion state, similarly to the waveform shown in FIG. 7(b), the drain current $I_d$ continues to flow toward the charge-accumulation capacitor 12, while the drain current $I_d$ is attenuated on the basis of the time constant τ. Then, similarly to the waveform shown in FIG. 7(c), the input voltage $V_{FD}$ of the amplification circuit 15 is increased. Consequently, the instantaneous value of the input voltage $V_{FD}$ of the amplification circuit 15 rises and falls as a pulse waveform in response to the change in the photodiode current $I_{ph}$ between the low level and the high level. This pulsating input voltage $V_{FD}$ of the amplification circuit 15 is read out through the amplification circuit 15 to the output-signal line $B_j$.

In the information-acquisition device 7 pertaining to the first embodiment, the nMOSFET is used for the reset-transistor Tr14. Thus, as the channel length of the reset-transistor Tr14 becomes short, the gate threshold voltage is shifted toward the negative direction, and there is the problem that it is difficult to control the sub-threshold voltage. In the cell $X_{ij}$ implementing the sensor array 21 in the information-acquisition device pertaining to the second embodiment, since the pMOSFET is used for the reset-transistor Tr14, the problem of the shift of the gate threshold voltage is not severe. Thus, since it is easy to control the sub-threshold voltage, the design for operating the reset-transistor Tr14 in the sub-threshold regime becomes easy. Hence, according to the sensor array 21 in the information-acquisition device pertaining to the second embodiment, it is possible to make the cell structure finer and finer, achieving the sensor array 21 in which the number of the pixels is large, and achieving the information-acquisition device in which a resolution is higher.

Figure 10:
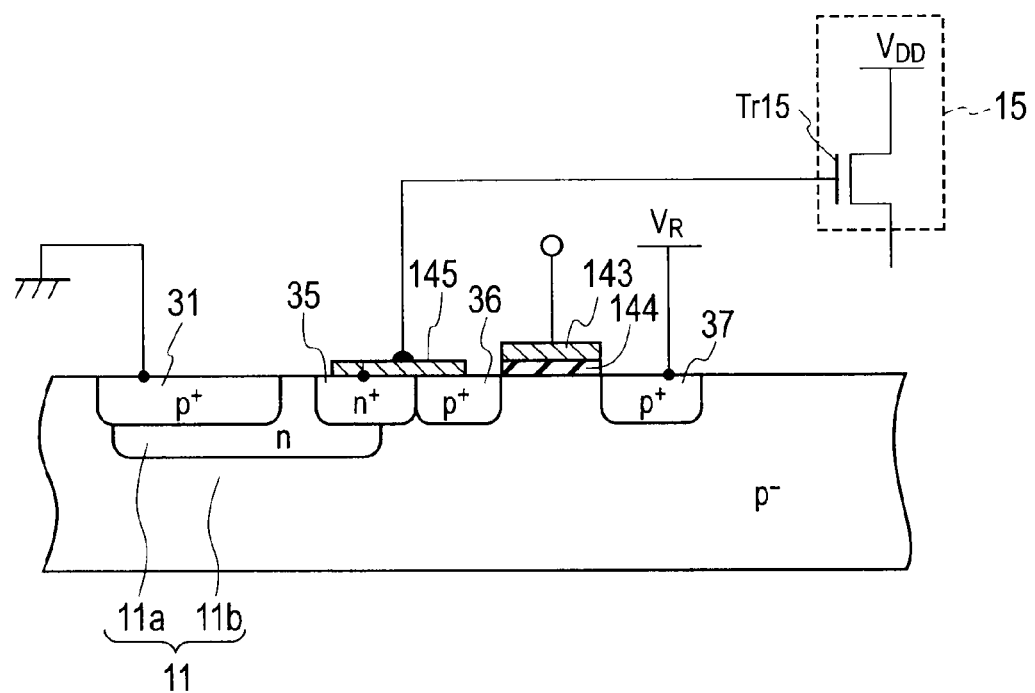
FIG. 10 is a cross-sectional view explaining an outline of the structure of the cell of the sensor array in the information-acquisition device pertaining to the second embodiment of the present invention.

As shown in FIG. 10, the cell $X_{ij}$, which is arrayed in the sensor array 21 pertaining to the second embodiment of the present invention is similar to the cell $X_{ij}$ pertaining to the first embodiment, in that a semiconductor layer 11b of the first conductivity type (p-type) and a surface-buried region 11a of the second conductivity type (n-type) arranged on the semiconductor layer 11b implement a photodiode 11, and that a pinning layer 31 of the first conductivity type ($p^+$-type) connected to the ground potential (the lower-level power supply) GND and a charge-accumulation region 35 of the second conductivity type ($n^+$-type) serving as the floating-diffusion region are arranged on a surface-buried region (the light-reception cathode region) 11a.

FIG. 8(b) shows the potential levels of the conduction bands in the surface of the semiconductor layer 11b. The carriers (electrons) generated in the charge-generation region (the light-reception anode region) are injected into the charge-accumulation region 35, which is buried in a part of the surface-buried region 11a just on the charge-generation region and is lower in potential level than the surface-buried region 11a. Since the impurity concentration of the surface-buried region 11a is set to be lower than the impurity concentration of the charge-accumulation region 35, the photodiode 11 can be operated at the fully depleted potential, and the value of a capacitance can be made irrelevant of the response in the charge-accumulation region 35, and the parasitic capacitance $C_{FD}$ can be made small. For this reason, while obtaining sufficient occupation area of the photodiode 11, it is possible to response to the optical-communication signal at higher speed.

Then, as shown in FIG. 10, on the surface of the semiconductor layer 11b of the first conductivity type, a reset source region 36 of the first conductivity type ($p^+$-type) is arranged adjacently to the charge-accumulation region 35, and a reset drain region 37 of the first conductivity type ($p^+$-type) is arranged separately from the reset source region 36. The charge-accumulation region 35 and the reset source region 36 are shorted to each other through a surface interconnection 145. A gate insulation film 144 is formed on the semiconductor layer 11b. The silicon oxide film ($SiO_2$ film) is preferable as the gate insulation film 144. However, an insulation gate structure of an insulated-gate transistor (MIS transistor) that uses various insulation films other than the silicon oxide film ($SiO_2$ film) is available. A reset gate electrode 143 is arranged on the gate insulation film 144. Then, the reset source region 36, the reset gate electrode 143 and the reset drain region 37 implement pMOSFET as the reset-transistor.

As shown in FIG. 10, the gate electrode of the buffer transistor Tr15 implementing the amplification circuit 15 is connected to the charge-accumulation region 35. The drain electrode of the buffer transistor Tr15 is connected to the higher-level power supply $V_{DD}$, and the source electrode is connected to the drain electrode of the read-out transistor Tr10 (please see FIG. 9). As shown in FIG. 9, the source electrode of the read-out transistor Tr10 is connected to the vertical output-signal line $B_j$, and the read-out signal in pulse waveform is applied to the gate electrode of the read-out transistor Tr10 through the second control-signal input terminal T4. That is, since the gate electrode of the read-out transistor Tr10 is set to the high (H) level, the read-out transistor Tr10 is turned on, and the current corresponding to the potential of the charge-accumulation region 32 is amplified by the buffer transistor Tr15, and the amplified current flows through the vertical output-signal line $B_j$.

According to the information-acquisition device pertaining to the second embodiment of the present invention, the reset-transistor Tr14 is designed to operate in the weak inversion state in a period when the optical-communication signal is received. Thus, when a very weak optical-communication signal is received, the drain current $I_d$ flowing through the reset-transistor Tr14 is amplified to the large value, and the input voltage $V_{FD}$ to the amplification circuit 15 is increased, which enables the optical-communication signal to be detected at a higher sensitivity. In particular, in the cell $X_{ij}$ implementing the sensor array 21 in the information-acquisition device pertaining to the second embodiment, since the pMOSFET is used for the reset-transistor Tr14, without any generation of the substrate effect, it is possible to achieve the more stable operation and the more miniaturized cell structure, and the resolution as an image sensor is improved. By the way, the fact that the omission of the pinning layer 31 is allowable and the fact that the double-layer structure composed of the semiconductor substrate of the first conductivity type ($p^+$-type) and the epitaxial growth structure of the first conductivity type ($p^+$-type) which is arranged on the semiconductor substrate and lower in impurity concentration than the semiconductor substrate may be formed to employ the epitaxial growth structure as "the semiconductor region of first conductivity type" are similar to the cell $X_{ij}$ pertaining to the first embodiment. Also, since the information-acquisition device pertaining to the second embodiment does not use the current amplification circuit used in the earlier technique, it is possible to miniaturize the element occupation area, reduce the electric power consumption and suppress the noise. Especially, in the miniaturized structure, it is possible to provide the information-acquisition device that can acquire both of the picture-information and the optical-communication signal information, and then, process both of the picture-information and the optical-communication signal information.

Moreover, according to the second embodiment of the present invention, by assembling the information-transmission unit that transmits the optical-communication signal with the information reception unit that has the information-acquisition device pertaining to the second embodiment, it is possible to provide an optical communication system of a high sensitivity, having a miniaturized shape with a smaller electric power consumption and a lower noise.

Third Embodiment

Although the illustration is omitted similarly to the second embodiment, an optical communication system pertaining to a third embodiment of the present invention encompasses an information-transmission unit 1 and an information reception unit 2, as already illustrated in FIG. 1, and an information-acquisition device 7 embedded in the information reception unit 2 has a function of acquiring the picture-information and the optical-communication signal information. Moreover, in the information-acquisition device pertaining to the third embodiment of the present invention, similarly to the configuration shown in FIG. 2, as one example, the sensor array 21 and the peripheral circuit (22, 23, 24 and $DCC_1$ to $DCC_m$) can be integrated on the same semiconductor chip. However, the structure of the cell $X_{ij}$ (i=1 to m; j=1 to n; m and n are the integers, respectively) implementing the sensor array 21 differs from the information-acquisition device 7 pertaining to the first and second embodiments, as already illustrated in FIG. 11. Consequently, the circuit configuration for achieving the higher response is created.

Figure 11:
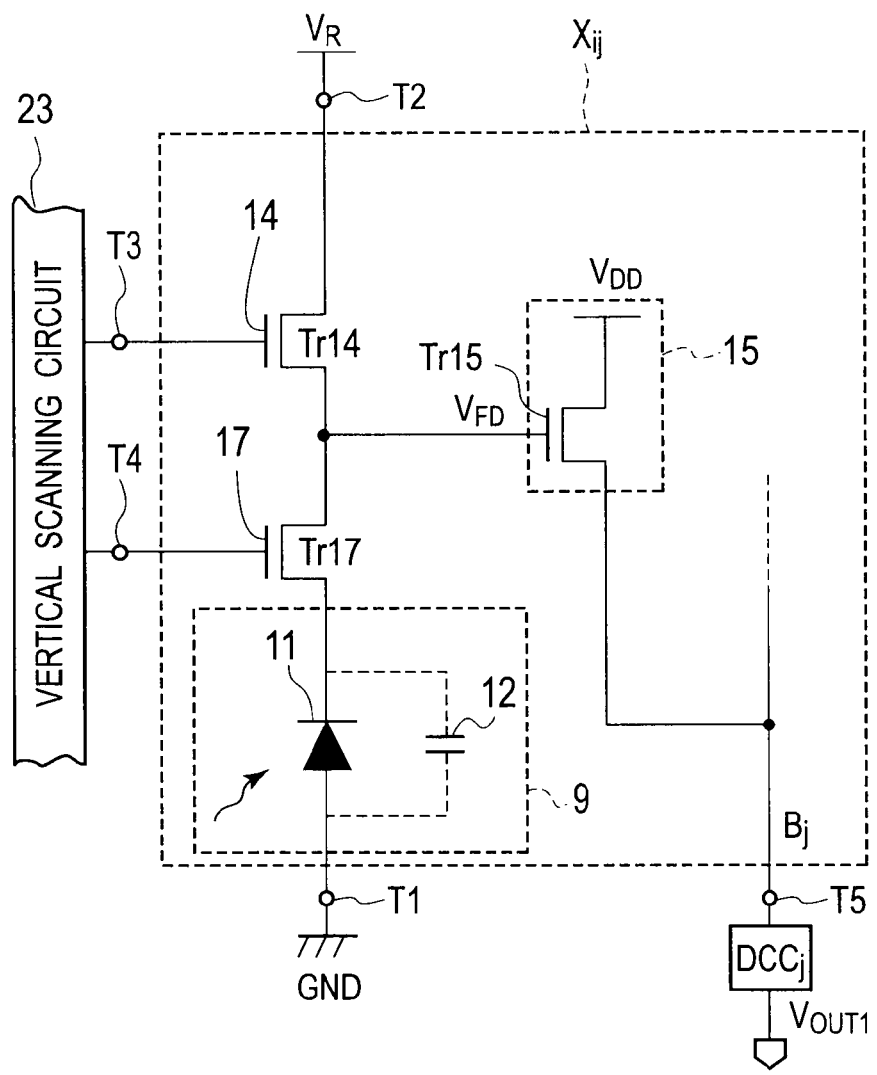
FIG. 11 is a view showing a specific circuit configuration of a cell, which implements a sensor array pertaining to a third embodiment of the present invention.

The cell $X_{ij}$ in the information-acquisition device 7 pertaining to the third embodiment in FIG. 11 encompasses a photoelectric-conversion accumulation element 9 for generating and accumulating the signal charge; a potential detection circuit 14 for detecting the signal charge generated by the photoelectric-conversion accumulation element 9 as the potential change; an amplification circuit 15 for amplifying the potential change and transmitting to the output-signal line $B_j$; and a charge transfer circuit 17 inserted between the photoelectric-conversion accumulation element 9 and the potential detection circuit 14. The photoelectric-conversion accumulation element 9, the charge transfer circuit 17 and the potential detection circuit 14 are connected in series between the first potential terminal T1 and the second potential terminal T2. The potential detection circuit 14 has an nMOSFET as the reset-transistor Tr14, which detects the potential change in the weak inversion state in a period when the optical-communication signal is received. Then, the charge transfer circuit 17 has an nMOSFET as a barrier transistor Tr17. On the other hand, the amplification circuit 15 has an nMOSFET as a buffer transistor Tr15. As shown in FIG. 11, the photoelectric-conversion accumulation element 9 has a photodiode 11 for generating the signal charge and a charge-accumulation capacitor 12 that is connected in parallel to the photodiode 11 and accumulates the signal charge generated by the photoelectric conversion. As described in the first embodiment, the photoelectric-conversion accumulation element 9 shown in FIG. 11 is represented by the equivalent circuit, and from the viewpoint of the physical structure, the charge-accumulation capacitor 12 is a capacitive component whose main building block is the junction capacitance of the photodiode 11. A gate electrode of the barrier transistor Tr17 is connected to the second control-signal input terminal T4, a drain electrode of the barrier transistor Tr17 is connected to the amplification circuit 15, and a source electrode of the barrier transistor Tr17 is connected to the cathode of the photodiode 11. By the way, the barrier transistor Tr17 can serve as a read-out transistor for switching the charge accumulation period and the charge transfer period, in the cell configured to acquire the other picture-information in the inside of the sensor array 21. That is, the circuit configuration shown in FIG. 11 has the barrier transistor Tr17. Thus, the selection circuit 19 shown in FIGS. 4 and 5 is omitted.

Figure 12:
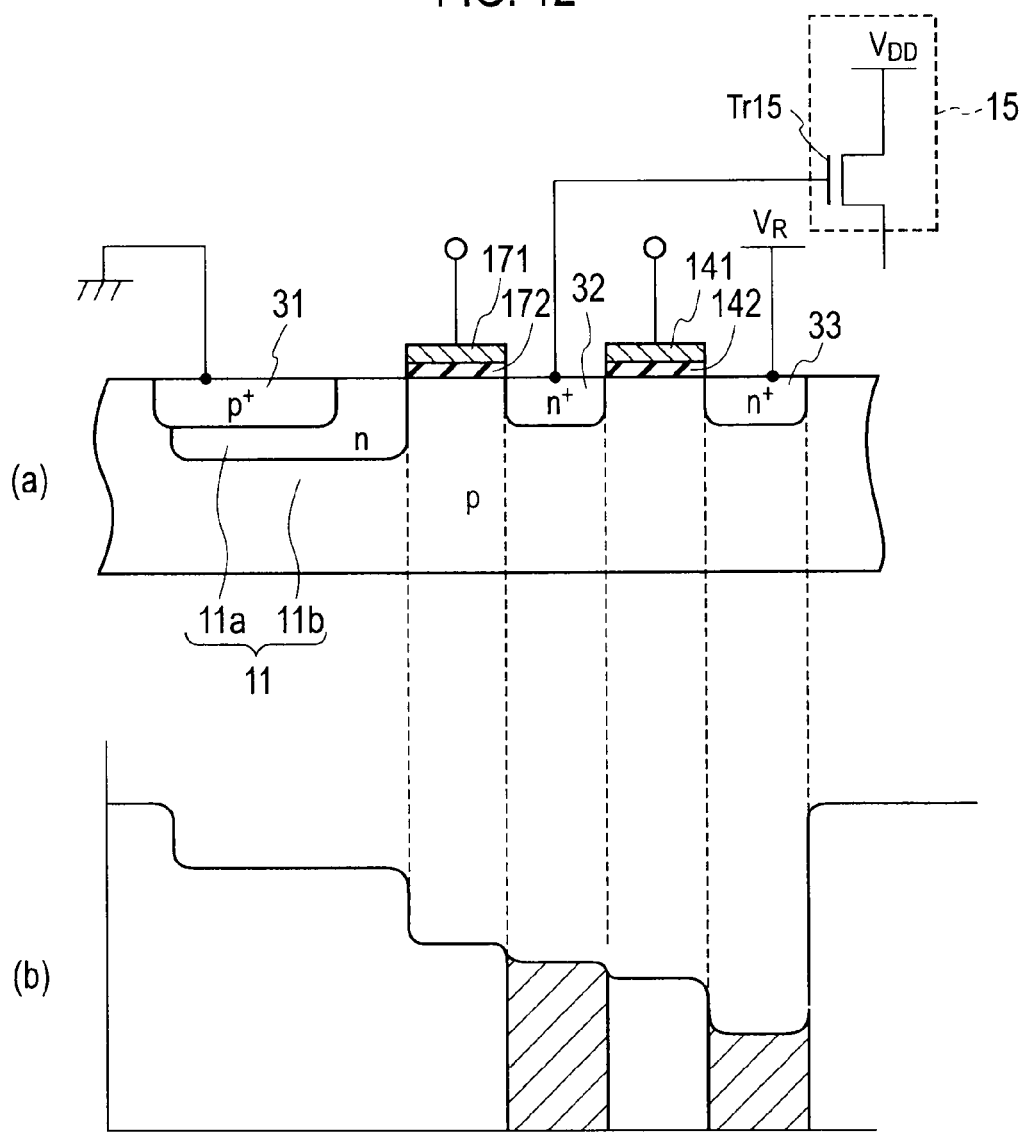
FIG. 12($a$) is a cross-sectional view explaining an outline of the structure of the cell in the sensor array in the information-acquisition device pertaining to the third embodiment shown in FIG. 11, and FIG. 12($b$) is a diagrammatic view showing a potential level of a conduction band on a surface of a p-type semiconductor substrate.

As shown in FIG. 12(a), in the cell $X_{ij}$, which is arrayed in the sensor array 21 pertaining to the third embodiment of the present invention, a semiconductor layer 11b of the first conductivity type (p-type) and a surface-buried region 11a of the second conductivity type (n-type) arranged on the semiconductor layer 11b implement the photodiode 11. A pinning layer 31 of the first conductivity type ($p^+$-type) connected to the ground potential (the lower-level power supply) GND is arranged on the surface-buried region (the light-reception cathode region) 11a. Moreover, as shown on the right side of FIG. 12(a), on the surface of the semiconductor layer 11b of the first conductivity type, a charge-accumulation region 32 of the second conductivity type ($n^+$-type) serving as the floating-diffusion region is arranged separately from the surface-buried region 11a, and a reset drain region 33 of the second conductivity type ($n^+$-type) in the reset-transistor Tr14 is arranged separately from the charge-accumulation region 32. The charge-accumulation region 32 also serves as a reset source region of the reset-transistor Tr14. A gate insulation film 172 is formed on the semiconductor layer 11b between the surface-buried region 11a and the charge-accumulation region 32, and the gate insulation film 142 is formed on the semiconductor layer 11b between the charge-accumulation region 32 and the reset drain region 33. As the gate insulation film 142, various insulation films can be employed other than the silicon oxide film ($SiO_2$ film). A reset gate electrode 141 is arranged on the gate insulation film 142. Then, the charge-accumulation region 32, the reset gate electrode 141 and the reset drain region 33 implement the nMOSFET serving as the reset-transistor Tr14. A barrier gate electrode 171 is arranged on the gate insulation film 172, and the semiconductor layer 11b serves as the source region. Then, the semiconductor layer 11b serving as the source region, the barrier gate electrode 171 and the charge-accumulation region 32 serving as the drain region implement the nMOSFET as the barrier transistor Tr17.

The pinning layer 31 is the layer for suppressing the generation of the carriers on the surface at the dark time. In an intended end-usage (application field) in which the dark current is not problematic, the pinning layer 31 may be structurally omitted. Also, on a semiconductor substrate, an epitaxial growth layer of the first conductivity type (p-type) having a lower impurity concentration than the semiconductor substrate may be formed, so that the epitaxial growth layer can be employed as "the semiconductor region of first conductivity type".

FIG. 12(b) shows potential levels of the conduction bands in the surface of the semiconductor layer 11b, when the barrier transistor Tr17 is turned on when a voltage at high level is applied to the barrier gate electrode 171 and at the same time, the reset-transistor Tr14 is turned on when a voltage at high level is applied to the reset gate electrode 141. The carriers (electrons) generated in the charge-generation region (the light-reception anode region) are injected into the charge-accumulation region 32 having a lower potential level than the surface-buried region 11a. Since the impurity concentration of the surface-buried region 11a is set to be lower than the impurity concentration of the charge-accumulation region 32, the photodiode 11 can be operated at the fully depleted potential, and the value of a capacitance can be made irrelevant of the response in the charge-accumulation region 32, and the parasitic capacitance $C_{FD}$ can be made small. For this reason, while obtaining sufficient occupation area of the photodiode 11, it is possible to response to the optical-communication signal at higher speed.

The read-out signal in pulse waveform is applied through the second control-signal input terminal T4 to the gate electrode of the barrier transistor Tr17. The voltage applied to the gate of the barrier transistor Tr17 is set to the potential at which all of the electrons generated in the photodiode 11 can flow into the charge-accumulation region 32. As shown in FIG. 12(a), the gate electrode of the buffer transistor Tr15 implementing the amplification circuit 15 is connected to the charge-accumulation region 32. The drain electrode of the buffer transistor Tr15 is connected to the higher-level power supply $V_{DD}$, and the source electrode is connected to the vertical output-signal line $B_j$ as already illustrated in FIG. 11. When the read-out signal in pulse waveform is applied through the second control-signal input terminal T4 to the gate electrode of the barrier transistor Tr17, the input voltage $V_{FD}$ as the potential corresponding to the charge quantity transferred to the charge-accumulation region 32 is applied to the gate electrode of the buffer transistor Tr15, and the current corresponding to the potential of the charge-accumulation region 32 is amplified by the buffer transistor Tr15 and read out to the vertical output-signal line $B_j$.

According to the information-acquisition device pertaining to the third embodiment of the present invention, because the current amplification circuit is not used, it is possible to miniaturize the element occupation area, reduce the electric power consumption and suppress the noise. Especially, in the miniaturized structure, it is possible to provide the information-acquisition device that can acquire both of the picture-information and the optical-communication signal information, and then, process both of the picture-information and the optical-communication signal information.

In particular, the information-acquisition device pertaining to the third embodiment can be designed such that, similarly to the first and second embodiments, because the reset-transistor Tr14 is operated in the weak inversion state in a period when the optical-communication signal is received, although a very weak optical-communication signal is received, the drain current $I_d$ flowing through the reset-transistor Tr14 is amplified to the large value, and then, the input voltage $V_{FD}$ to the amplification circuit 15 is made large, which enables the optical-communication signal to be detected at a higher sensitivity.

Moreover, since the configuration in which the barrier transistor Tr17 is connected between the photodiode 11 and the amplification circuit 15 is employed, it is easy to design the structure in which the impurity concentration of the surface-buried region 11a is set to be lower than the impurity concentration of the charge-accumulation region 32. For this reason, according to the information-acquisition device pertaining to the third embodiment, the photodiode 11 can be operated at the fully depleted potential, and the value of a capacitance can be made irrelevant of the response in the charge-accumulation region 32. Thus, the parasitic capacitance $C_{FD}$ can be made small. Hence, according to the information-acquisition device pertaining to the third embodiment, while obtaining sufficient occupation area of the photodiode 11 and keeping the high sensitivity, it is possible to provide the information-acquisition device that can response to the optical-communication signal at higher speed.

Moreover, according to the information-acquisition device pertaining to the third embodiment of the present invention, by assembling the information-transmission unit that transmits the optical-communication signal with the information reception unit that has the information-acquisition device pertaining to the third embodiment, it is possible to provide an optical communication system of a high sensitivity, having a miniaturized shape with a smaller electric power consumption and a lower noise.

Fourth Embodiment

Although the illustration is omitted similarly to the second and third embodiments, an optical communication system pertaining to a fourth embodiment of the present invention encompasses an information-transmission unit 1 and an information reception unit 2, as already illustrated in FIG. 1, and an information-acquisition device 7 embedded in the information reception unit 2 has a function of acquiring the picture-information and the optical-communication signal information. Moreover, in the information-acquisition device pertaining to the fourth embodiment of the present invention, similarly to the configuration shown in FIG. 2, as one example, the sensor array 21 and the peripheral circuit (22, 23, 24 and $DCC_1$ to $DCC_m$) can be integrated on the same semiconductor chip. However, as shown in FIG. 13, a feature that the read-out circuit encompasses the direct current noise canceling circuit $DCC_j$ and a noise canceller circuit $NC_j$ differs from the information-acquisition device 7 pertaining to the first to third embodiments.

Figure 13:
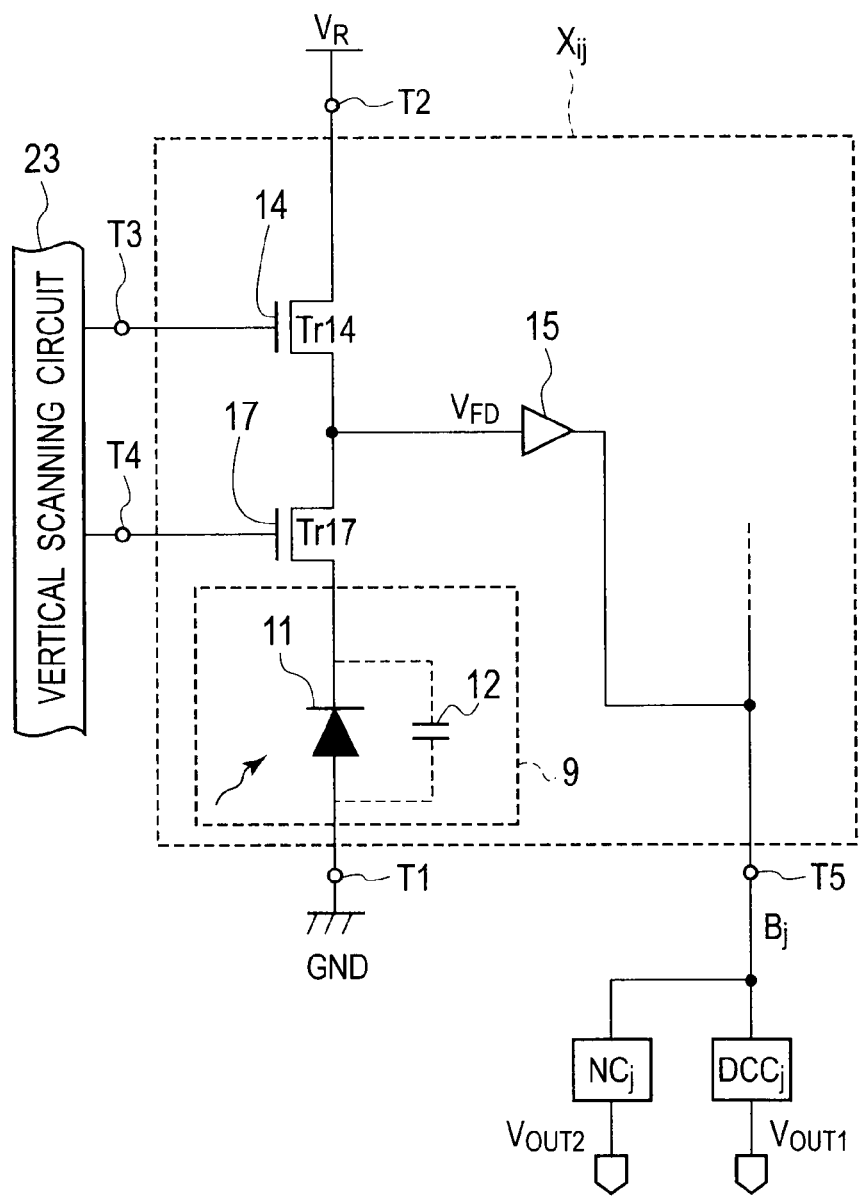
FIG. 13 is a view showing a circuit configuration of a cell, which implements a sensor array pertaining to a fourth embodiment of the present invention.

On the other hand, as shown in FIG. 13, the circuit configuration in which the cell $X_{ij}$ implementing the sensor array 21 in the information-acquisition device pertaining to the fourth embodiment encompasses a reset-transistor Tr14 formed of nMOSFET in which the drain electrode is connected through the second potential terminal T2 to the reset voltage $V_R$, and the gate electrode is connected to the first control-signal input terminal T3; a barrier transistor Tr17 formed of nMOSFET in which the drain electrode is connected to the source electrode of the reset-transistor Tr14, and the gate electrode is connected to the second control-signal input terminal T4; a photodiode 11 in which the cathode is connected to the source electrode of the barrier transistor Tr17, and the anode is connected through the first potential terminal T1 to the ground potential (the lower-level power supply) GND; and an amplification circuit 15 which amplifies the potential of the middle point P10 between the barrier transistor Tr17 and the reset-transistor Tr14 and transmits the potential to the output-signal line is similar to the information-acquisition device pertaining to the third embodiment. Thus, the duplicated explanation is omitted.

In the information-acquisition device 7 pertaining to the fourth embodiment shown in FIG. 13, the direct current noise canceling circuit $DCC_j$ and the noise canceller circuit $NC_j$ are commonly connected to the output-signal terminal T5. For this reason, in the cell $X_{ij}$ of the information-acquisition device 7 pertaining to the fourth embodiment, by switching to any one of a mode at which the optical-communication signal is received and a mode at which the picture is imaged, it is possible to selectively select any one of the optical-communication signal information and the picture-information. Also, the barrier transistor Tr17 doubles as the role of the read-out transistor for switching the charge transfer period and the charge accumulation period when the picture-information is imaged.

FIG. 14(a) shows the driving architectures of the cell $X_{ij}$ shown in FIG. 13, when the information-acquisition device 7 pertaining to the fourth embodiment selects an optical-communication signal reception mode. FIG. 14(a) shows the driving architectures of the reset-transistor Tr14 and the barrier transistor Tr17 when the optical-communication signal is received and not received. FIG. 14(b) shows the driving architectures of the cell $X_{ij}$ shown in FIG. 13 when a picture-imaging mode is selected. FIG. 14(b) shows the driving architectures of the reset-transistor Tr14 and the barrier transistor Tr17 when the picture is imaged and not imaged.

As shown in FIG. 14(a), when the optical-communication signal is received at the optical-communication signal reception mode, the reset-transistor Tr14 and the barrier transistor Tr17 are both controlled to be on state. Since the reset-transistor Tr14 and the barrier transistor Tr17 are both controlled to be on state, the potential on the input side of the amplification circuit 15 is not in the floating state. Thus, the input voltage $V_{FD}$ of the amplification circuit 15 rises and falls as a pulse waveform on the basis of the repetition of the accumulation and discharging of the charges generated in the photodiode 11. The pulsating input voltage $V_{FD}$ is read through the amplification circuit 15 to the output-signal line $B_j$, and converted into a digital signal by the direct current noise canceling circuit $DCC_j$. Consequently, the cell $X_{ij}$ can acquire the optical-communication signal information at the optical-communication signal reception mode. Also, in the cell $X_{ij}$, since the barrier transistor Tr17 is controlled to be on state, it is possible to response to the optical-communication signal at higher speed. When the optical-communication signal is not received at the optical-communication signal reception mode, both of the reset-transistor Tr14 and the barrier transistor Tr17 are controlled to be in off sates.

As shown in FIG. 14(b), when the picture is imaged at the picture-imaging mode, in order to initialize the charge quantity of the charge-accumulation capacitor 12, the reset signal in pulse waveform is applied to the gate electrode of the reset-transistor Tr14, and the reset-transistor Tr14 is turned on. At this time, the barrier transistor Tr17 is also controlled to be on state. Consequently, the charge quantity of the charge-accumulation capacitor 12 is initialized in accordance with the reset voltage $V_R$. The reset voltage $V_R$ is controlled in off state, after the initialization. Consequently, the cathode side of the photodiode 11 becomes in the floating state. Moreover, the barrier transistor Tr17 is controlled in off state in the charge accumulation period, and turned on in the charge transfer period. When the light is irradiated to the cell $X_{ij}$ in the charge accumulation period, the charges are generated in the photodiode 11. When the generated charges are accumulated in the charge-accumulation capacitor 12, the input voltage $V_{FD}$ of the amplification circuit 15 is decreased. When the barrier transistor Tr17 is turned on, after the elapse of a predetermined period, the input voltage $V_{FD}$ (or the amplification voltage based on the input voltage $V_{FD}$) is transferred through the amplification circuit 15 to the output-signal line and supplied through the noise canceller circuit $NC_j$ to an output $V_{OUT2}$. Consequently, the cell $X_{ij}$ can acquire the picture-information, at the picture-imaging mode. When the picture is not imaged, both of the reset-transistor Tr14 and the barrier transistor Tr17 are controlled to be in off sates.

Figure 15:
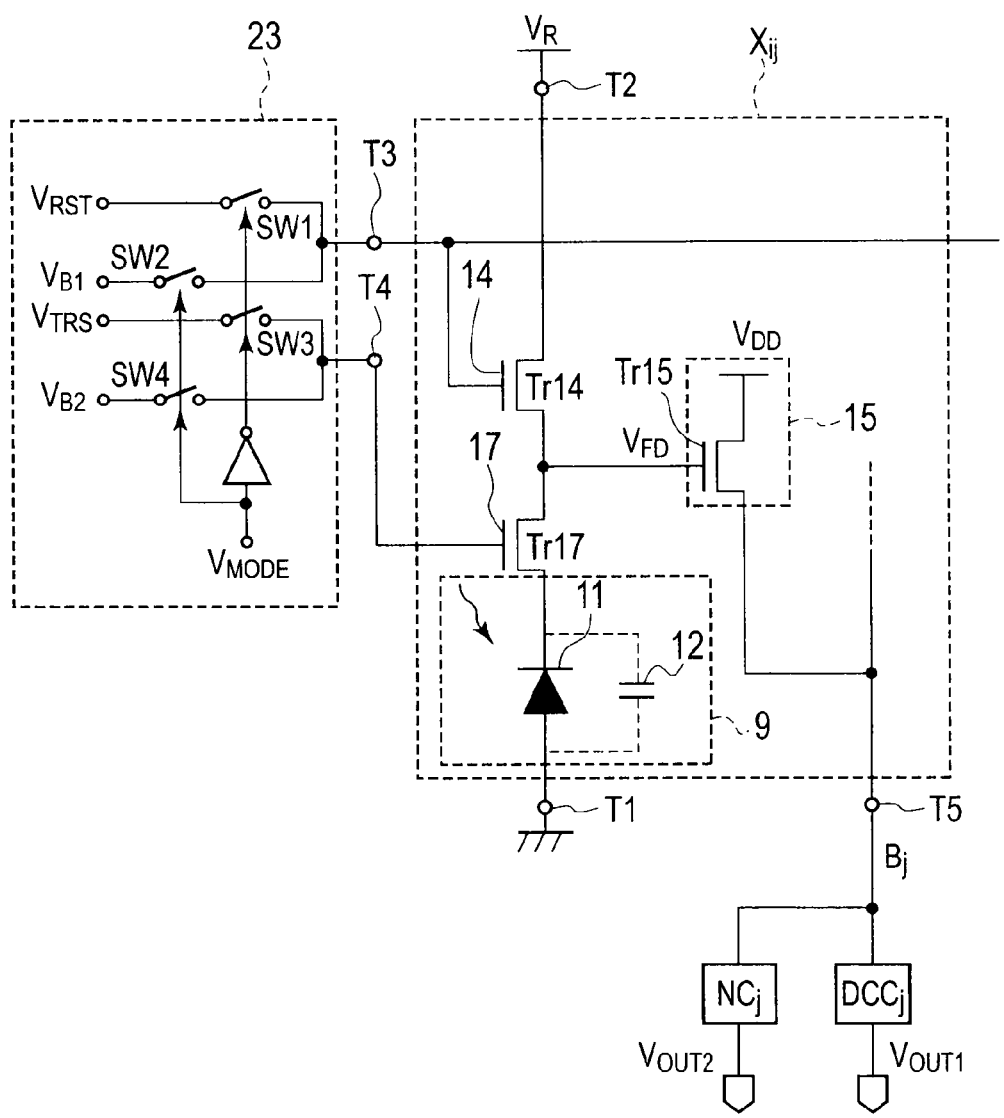
FIG. 15 is a view showing the specific circuit configuration of the information-acquisition device pertaining to the fourth embodiment of the present invention.

FIG. 15 shows one example of the circuit configuration of the vertical scanning circuit 23 in the information-acquisition device 7 pertaining to the fourth embodiment. The vertical scanning circuit 23 encompasses a terminal for transmitting the reset signal $V_{RST}$ in the pulse waveform to the gate electrode of the reset-transistor Tr14; a terminal for transmitting an ON-signal $V_{B1}$ of the reset-transistor Tr14 to the gate electrode of the reset-transistor Tr14; a terminal for transmitting a switching signal $V_{TRS}$ in the pulse waveform, which switches between the charge accumulation period and the charge transfer period, to the gate electrode of the barrier transistor Tr17; and a terminal for transmitting an ON-signal $V_{B2}$ of the barrier transistor Tr17 to the gate electrode of the barrier transistor Tr17. The reset signal $V_{RST}$ in the pulse waveform is configured to apply to the gate electrode of the reset-transistor Tr14 through a first switch SW1, the ON-signal $V_{B1}$ is configured to apply to the gate electrode of the reset-transistor Tr14 through a second switch SW2, the switching signal $V_{TRS}$ in the pulse waveform is configured to apply to the gate electrode of the barrier transistor Tr17 through a third switch SW3, and the ON-signal $V_{B2}$ is configured to apply to the gate electrode of the barrier transistor Tr17 through a fourth switch SW4. For this reason, the vertical scanning circuit 23 further encompasses a mode terminal for transmitting a mode-exchange signal $V_{MODE}$ transmitted from the controlling/processing circuit 6 (please see FIG. 1) to the first switch SW1, the second switch SW2, the third switch SW3 and the fourth switch SW4. The mode-exchange signal $V_{MODE}$ is inverted by an inverter circuit and then transferred to the first switch SW1 and the third switch SW3. The mode-exchange signal $V_{MODE}$ switches between the optical-communication signal reception mode and the picture-imaging mode.

At the optical-communication signal reception mode, the first switch SW1 and the third switch SW3 are on states, and the second switch SW2 and the fourth switch SW4 are off states. Consequently, the ON-signal $V_{B1}$ is applied to the gate electrode of the reset-transistor Tr14, and the ON-signal $V_{B2}$ is fed to the barrier transistor Tr17. Thus, the reset-transistor Tr14 and the barrier transistor Tr17 are both controlled to be on state.

At the picture-imaging mode, the first switch SW1 and the third switch SW3 are on states, and the second switch SW2 and the fourth switch SW4 are off states. Consequently, the reset signal $V_{RST}$ in the pulse waveform is applied to the gate electrode of the reset-transistor Tr14, and the switching signal $V_{TRS}$ in the pulse waveform is fed to the barrier transistor Tr17. When the reset signal $V_{RST}$ and the switching signal $V_{TRS}$ that exhibit the pulse waveforms become high in synchronization with each other, the reset-transistor Tr14 and the barrier transistor Tr17 are controlled to be in on state at the same time, and the charge-accumulation capacitor 12 is initialized. When the reset signal $V_{RST}$ is in the low level, the switching signal $V_{TRS}$ switches between the low and high levels. Thus, the charge accumulation period and the charge transfer period can be switched.

According to the information-acquisition device pertaining to the fourth embodiment of the present invention, because the current amplification circuit is not used, it is possible to miniaturize the element occupation area, reduce the electric power consumption and suppress the noise. Especially, in the miniaturized structure, it is possible to provide the information-acquisition device that can acquire both of the picture-information and the optical-communication signal information, and then, process both of the picture-information and the optical-communication signal information. In particular, with the configuration in which each cell $X_{ij}$ encompasses both of the direct current noise canceling circuit $DCC_j$ and the noise canceller circuit $NC_j$, each cell $X_{ij}$ can selectively acquire any one of the optical-communication signal information and the picture-information, by switching to the mode for receiving the optical-communication signal or to the mode for imaging the picture.

Moreover, similarly to the first to third embodiments, the information-acquisition device pertaining to the fourth embodiment can be designed such that, if the reset-transistor Tr14 is configured to be operated in the weak inversion state in a period when the optical-communication signal is received, although a very weak optical-communication signal is received, the input voltage $V_{FD}$ to the amplification circuit 15 is made large. Thus, it is possible to detect the optical-communication signal at a higher sensitivity.

Moreover, according to the information-acquisition device pertaining to the fourth embodiment of the present invention, by assembling the information-transmission unit that transmits the optical-communication signal with the information reception unit that has the information-acquisition device pertaining to the fourth embodiment, it is possible to provide an optical communication system of a high sensitivity, having a miniaturized shape with a smaller electric power consumption and a lower noise.

Fifth Embodiment

Figure 16:
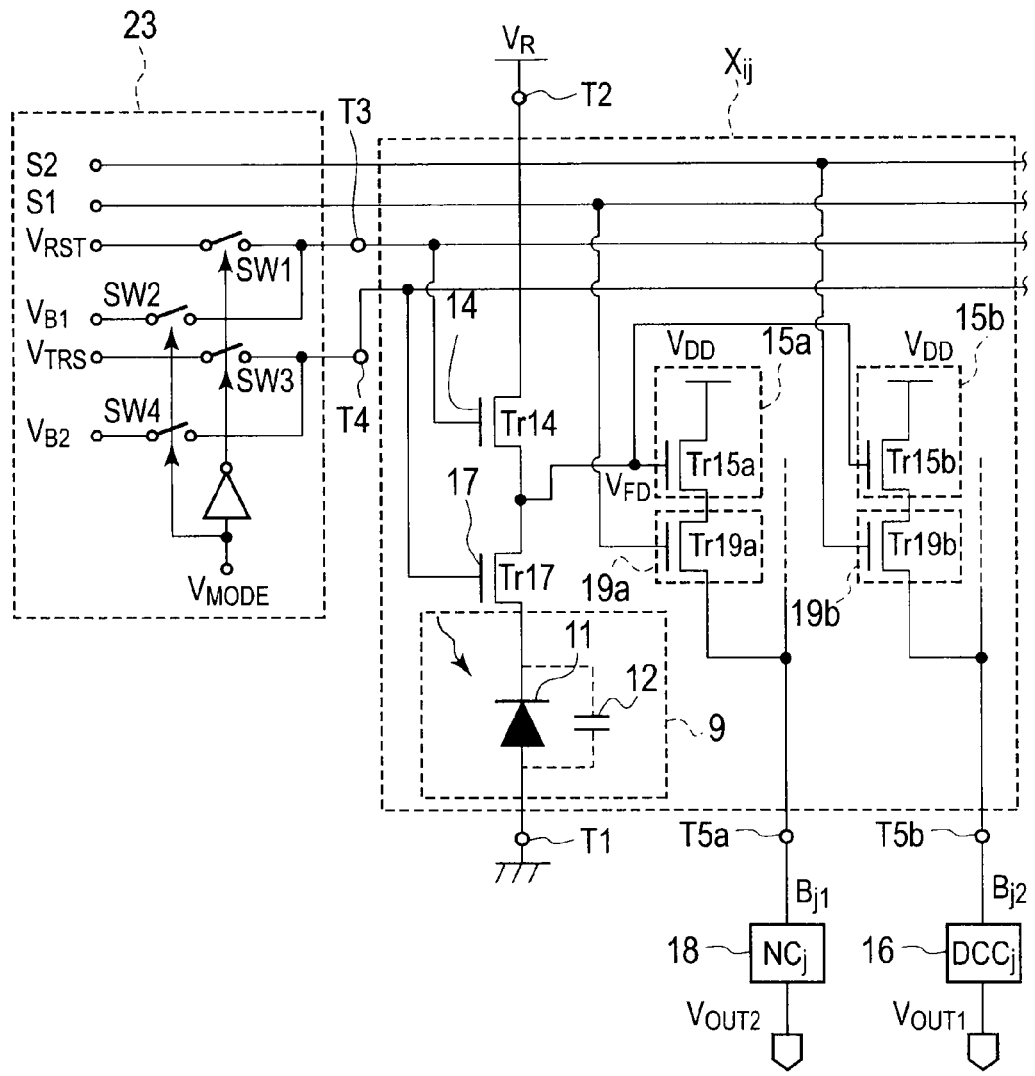
FIG. 16 is a view showing a specific circuit configuration of an information-acquisition device pertaining to a fifth embodiment of the present invention.

Although the illustration is omitted similarly to the second to fourth embodiments, an optical communication system pertaining to the fifth embodiment of the present invention encompasses an information-transmission unit 1 and an information reception unit 2, as already illustrated in FIG. 1, and an information-acquisition device 7 embedded in the information reception unit 2 has a function of acquiring the picture-information and the optical-communication signal information. Moreover, in the information-acquisition device pertaining to the fifth embodiment of the present invention, similarly to the configuration shown in FIG. 2, as one example, the sensor array 21 and the peripheral circuit (22, 23, 24 and $DCC_1$ to $DCC_m$) can be integrated on the same semiconductor chip. However, as shown in FIG. 16, a feature that the read-out circuit encompasses a direct current noise canceling circuit $DCC_j$ and a noise canceller circuit $NC_j$, and further a feature that the noise canceller circuit $NC_j$ and the direct current noise canceling circuit $DCC_j$ are connected to a first output-signal line $B_{j1}$ and a second output-signal line $B_{j2}$, which are independent of each other, respectively, differ from the information-acquisition device 7 pertaining to the first to fourth embodiments. According to the configuration of the information-acquisition device pertaining to the fifth embodiment shown in FIG. 16, the optical-communication signal can be received on a particular row, and simultaneously with the optical-communication signal, the picture can be imaged on a different row.

As shown in FIG. 16, a topology of the circuit configuration in which the cell $X_{ij}$ implementing the sensor array 21 in the information-acquisition device pertaining to the fifth embodiment encompasses a reset-transistor Tr14 formed of nMOSFET in which the drain electrode is connected through the second potential terminal T2 to the reset voltage $V_R$, and the gate electrode is connected to the first control-signal input terminal T3; a barrier transistor Tr17 formed of nMOSFET in which the drain electrode is connected to the source electrode of the reset-transistor Tr14, and the gate electrode is connected to the second control-signal input terminal T4; and a photodiode 11 in which the cathode is connected to the source electrode of the barrier transistor Tr17, and the anode is connected through the first potential terminal T1 to the ground potential (the lower-level power supply) GND is similar to the information-acquisition device pertaining to the third and fourth embodiments. However, a feature that the potential of the middle point P10 between the barrier transistor Tr17 and the reset-transistor Tr14 is applied to each of a first amplification circuit 15a and a second amplification circuit 15b, and output signals, which are amplified by the first amplification circuit 15a and the second amplification circuit 15b, are transmitted through a first selection circuit 19a and a second selection circuit 19b to the first output-signal line $B_{j1}$ and the second output-signal line $B_{j2}$, which are independent of each other, respectively, differs from the information-acquisition device pertaining to the third and fourth embodiments.

As shown in FIG. 16, the first amplification circuit 15a has a first buffer transistor Tr15a so as to implement a source follower circuit, in which a drain electrode of the first buffer transistor Tr15a is connected to the higher-level power supply $V_{DD}$, and a gate electrode of the first buffer transistor Tr15a is connected to the middle point P10 between the barrier transistor Tr17 and the reset-transistor Tr14. The first selection circuit 19a has a first selection transistor Tr19a, and a drain electrode of the first selection transistor Tr19a is connected to a source electrode of the first buffer transistor Tr15a, a gate electrode of the first selection transistor Tr19a is connected to a signal-delivering interconnection for a first selection signal S1, and a source electrode of the first selection transistor Tr19a is connected to the first output-signal line $B_{j1}$. On the other hand, the second amplification circuit 15b has also a second buffer transistor Tr15b so as to implement a source follower circuit, in which a drain electrode of the second amplification circuit 15b is connected to the higher-level power supply $V_{DD}$, and a gate electrode of the second amplification circuit 15b is connected to the middle point P10 between the barrier transistor Tr17 and the reset-transistor Tr14. The second selection circuit 19b has a second selection transistor Tr19b, and a drain electrode of the second selection transistor Tr19b is connected to a source electrode of the second buffer transistor Tr15b, a gate electrode of the second selection transistor Tr19b is connected to a signal-delivering interconnection for a second selection signal S2, and a source electrode of the second selection transistor Tr19b is connected to the second signal line $B_{j2}$.

The first output-signal line $B_{j1}$ is connected through a first output-signal terminal T5a to the noise canceller circuit $NC_j$. The second output-signal line $B_{j2}$ is connected through a second output-signal terminal T5b to the direct current noise canceling circuit $DCC_j$. The first selection signal S1 is applied to the gate electrode of the first selection circuit 19a, and the second selection signal S2 is applied to the gate electrode of the second selection circuit 19b.

For example, when the optical-communication signal is desired to be received on a particular row, the second switch SW2 and the fourth switch SW4 in the vertical scanning circuit 23 are turned on by the mode-exchange signal $V_{MODE}$, and in accordance with the ON-signal $V_{B1}$ and the ON-signal $V_{B2}$, both of the reset-transistor Tr14 and the barrier transistor Tr17 on the row are controlled to be in on state. Consequently, the input voltage $V_{FD}$ of the second amplification circuit 15b rises and falls as a pulse waveform on the basis of the repetition of the accumulation and discharging of the charges generated in the photodiode 11. The pulsating input voltage $V_{FD}$ is fed to the second amplification circuit 15b. By the vertical scanning circuit 23, the first selection signal S1 on the row is set to the low potential and further the second selection signal S2 on the row is set to the high potential, the output is read out through the second amplification circuit 15b and the second selection circuit 19b to the second output-signal line B2 and converted into the digital signal by the direct current noise canceling circuit $DCC_j$.

When the picture is imaged on the particular row, the first switch SW1 and the third switch SW3 in the vertical scanning circuit 23 are turned on by the inverted mode-exchange signal $V_{MODE}$. That is, in order to initialize the charge quantity of the charge-accumulation capacitor 12 on the row, the reset signal $V_{RST}$ in the pulse waveform is applied to the gate electrode of the reset-transistor Tr14, and the reset-transistor Tr14 is turned on. At this time, even the barrier transistor Tr17 is controlled to turn on by the switching signal $V_{TRS}$ in the pulse waveform. Consequently, the charge quantity of the charge-accumulation capacitor 12 is initialized in accordance with the reset voltage $V_R$. Even the barrier transistor Tr17 is controlled in off state by the switching signal $V_{TRS}$ in the pulse waveform after the initialization. Consequently, the cathode side of the photodiode 11 becomes in the floating state. Moreover, the barrier transistor Tr17 is controlled in off state in the charge accumulation period and turned on in the charge transfer period by the switching signal $V_{TRS}$ in the pulse waveform. When the light is irradiated to the cell $X_{ij}$ in the charge accumulation period, the charges are generated in the photodiode 11. When the generated charges are accumulated in the charge-accumulation capacitor 12, the input voltage $V_{FD}$ of the first amplification circuit 15a is decreased. After the elapse of a predetermined period, when the first selection signal S1 on the row is set to the high potential and then the second selection signal S2 on the row is set to the low potential, the output is read out through the first amplification circuit 15a and the first selection circuit 19a to the first output-signal line $B_{j1}$, and the noise is removed by the noise canceller circuit $NC_j$. In this way, the optical-communication signal can be received on the particular row, and simultaneously, the picture can be imaged on a different row.

By the way, the first amplification circuit 15a and the second amplification circuit 15b can be configured by one buffer circuit. In this case, both of the first selection circuit 19a and the second selection circuit 19b are connected to the common buffer circuit.

According to the information-acquisition device pertaining to the fifth embodiment of the present invention, similarly to the first to fourth embodiments, it is possible to miniaturize the element occupation area, reduce the electric power consumption and suppress the noise. Especially, in the miniaturized structure, it is possible to provide the information-acquisition device that can acquire both of the picture-information and the optical-communication signal information, and then, process both of the picture-information and the optical-communication signal information. In particular, the read-out circuit in each cell $X_{ij}$ encompasses the direct current noise canceling circuit $DCC_j$ and the noise canceller circuit $NC_j$, and the noise canceller circuit $NC_j$ and the direct current noise canceling circuit $DCC_j$ are configured to be connected to the first output-signal line $B_{j1}$ and the second output-signal line $B_{j2}$, which are independent of each other, respectively. Thus, the optical-communication signal can be received on the particular row, and simultaneously, the picture can be imaged on the different row.

Moreover, similarly to the first to fourth embodiments, in the information-acquisition device pertaining to the fifth embodiment, because the reset-transistor Tr14 is operated in the weak inversion state in a period when the optical-communication signal is received, the optical-communication signal can be detected at a higher sensitivity.

Moreover, according to the information-acquisition device pertaining to the fifth embodiment of the present invention, by assembling the information-transmission unit that transmits the optical-communication signal with the information reception unit that has the information-acquisition device pertaining to the fifth embodiment, it is possible to provide an optical communication system of a high sensitivity, having a miniaturized shape with a smaller electric power consumption and a lower noise.

Sixth Embodiment

Although the illustration is omitted similarly to the second to fifth embodiments, an optical communication system pertaining to a sixth embodiment of the present invention encompasses an information-transmission unit 1 and an information reception unit 2, as already illustrated in FIG. 1, and an information-acquisition device 7 embedded in the information reception unit 2 has a function of acquiring the picture-information and the optical-communication signal information. Moreover, in the information-acquisition device pertaining to the sixth embodiment of the present invention, similarly to the configuration shown in FIG. 2, as one example, the sensor array 21 and the peripheral circuit (22, 23, 24 and $DCC_1$ to $DCC_m$) can be integrated on the same semiconductor chip. However, as already illustrated in FIG. 17, a feature that the read-out circuit encompasses a direct current noise canceling circuit $DCC_j$ and a noise canceller circuit $NC_j$, and a feature that the noise canceller circuit $NC_j$ and the direct current noise canceling circuit $DCC_j$ are connected to a vertical output-signal line $B_{j1}$ and a horizontal output-signal line $H_i$, which are independent of each other, respectively, and a feature that the optical-communication signal information is extracted through the horizontal output-signal line $H_i$ from a horizontal direction differ from the information-acquisition device 7 pertaining to the first to fifth embodiments.

Figure 17:
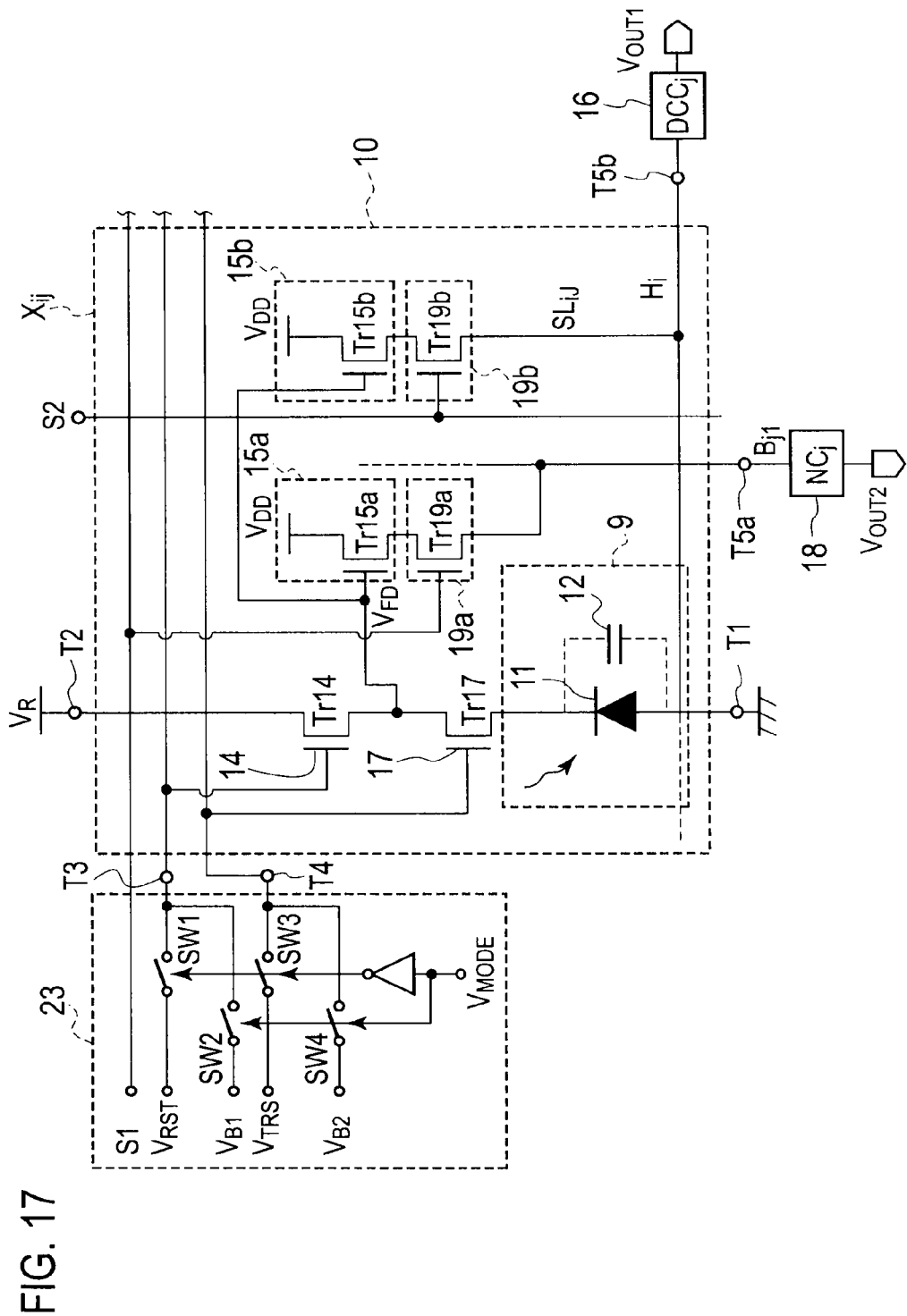
FIG. 17 is a view showing a specific circuit configuration of an information-acquisition device pertaining to a sixth embodiment of the present invention.
Figure 18:
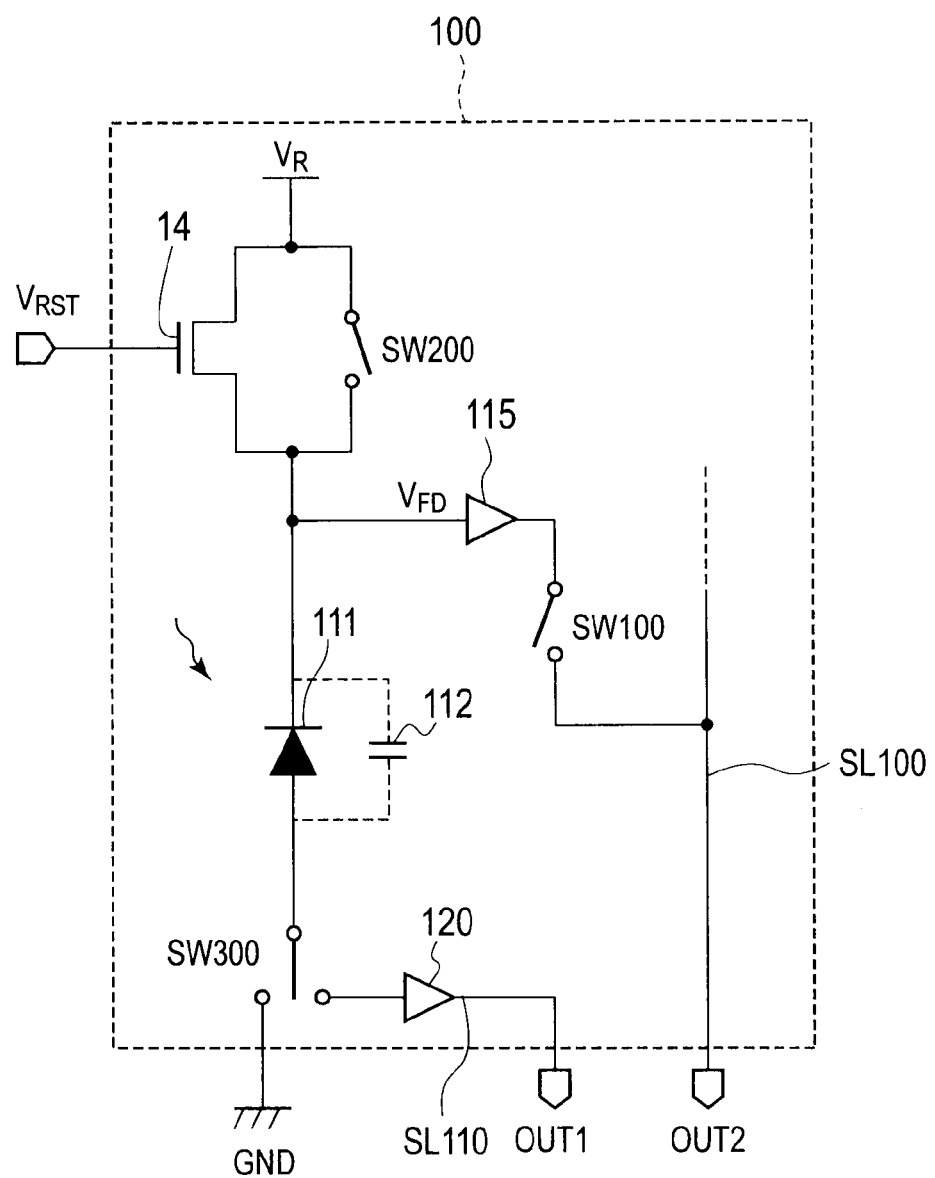
FIG. 18 is a schematic view showing an outline of the circuit configuration of the cell, which implements the earlier sensor array.

As shown in FIG. 17, a configuration such that a cell $X_{ij}$ implementing the sensor array 21 in the information-acquisition device pertaining to the sixth embodiment encompasses a reset-transistor Tr14 formed of nMOSFET in which the drain electrode is connected through the second potential terminal T2 to the reset voltage $V_R$, and the gate electrode is connected to the first control-signal input terminal T3; a barrier transistor Tr17 formed of nMOSFET in which the drain electrode is connected to the source electrode of the reset-transistor Tr14, and the gate electrode is connected to the second control-signal input terminal T4; and a photodiode 11 in which the cathode is connected to the source electrode of the barrier transistor Tr17, and the anode is connected through the first potential terminal T1 to the ground potential (the lower-level power supply) GND, and the potential of the middle point P10 between the barrier transistor Tr17 and the reset-transistor Tr14 is fed to each of the first amplification circuit 15a and the second amplification circuit 15b is similar to the information-acquisition device 7 pertaining to the fifth embodiment. However, in the information-acquisition device pertaining to the sixth embodiment, a feature that an output signal amplified by the first amplification circuit 15a is transmitted through the first selection circuit 19a to the vertical output-signal line $B_{j1}$, and an output signal amplified by the second amplification circuit 15b is transmitted through the second selection circuit 19b and an in-cell output-signal line $SL_{ij}$ to the horizontal output-signal line $H_i$, independently of the vertical output-signal line differs from the information-acquisition device pertaining to the fifth embodiment.

As shown in FIG. 17, the first amplification circuit 15a is configured as the source follower circuit and has the first buffer transistor Tr15a in which the drain electrode is connected to the higher-level power supply $V_{DD}$, and the gate electrode is connected to the middle point P10 between the barrier transistor Tr17 and the reset-transistor Tr14. The first selection circuit 19a has the first selection transistor Tr19a in which the drain electrode is connected to the source electrode of the first buffer transistor Tr15a, the gate electrode is connected to the signal-delivering interconnection for the first selection signal S1, and the source electrode is connected to the first output-signal line $B_{j1}$. On the other hand, the second amplification circuit 15b is also configured as the source follower circuit and has the second buffer transistor Tr15b in which the drain electrode is connected to the higher-level power supply $V_{DD}$, and the gate electrode is connected to the middle point P10 between the barrier transistor Tr17 and the reset-transistor Tr14. The second selection circuit 19b has the second selection transistor Tr19b in which the drain electrode is connected to the source electrode of the second buffer transistor Tr15b, the gate electrode is connected to the signal-delivering interconnection for the second selection signal S2, and the source electrode is connected through the in-cell output-signal line $SL_{ij}$ to the horizontal output-signal line $H_i$.

The vertical output-signal line $B_{j1}$ is connected through a first output-signal terminal T5a to the noise canceller circuit $NC_j$. The horizontal output-signal line $H_i$ is connected through a second output-signal terminal T5b to the direct current noise canceling circuit $DCC_j$. The first selection signal S1 is applied to the gate electrode of the first selection circuit 19a from the vertical scanning circuit 23, and the second selection signal S2 is applied to the gate electrode of the second selection circuit 19b from the horizontal scanning circuit 22 (please see FIG. 2).

For example, when the optical-communication signal is desired to be received on the particular row, the second switch SW2 and the fourth switch SW4 in the vertical scanning circuit 23 are turned on by the mode-exchange signal $V_{MODE}$, and in accordance with the ON-signal $V_{B1}$ and the ON-signal $V_{B2}$, both of the reset-transistor Tr14 and the barrier transistor Tr17 on the row are controlled to be in on state. Consequently, the input voltage $V_{FD}$ of the second amplification circuit 15b rises and falls as a pulse waveform on the basis of the repetition of the accumulation and discharging of the charges generated in the photodiode 11. The pulsating input voltage $V_{FD}$ is fed to the second amplification circuit 15b. By the vertical scanning circuit 23, when the first selection signal S1 on the row is set to the low potential, and by the horizontal scanning circuit 22, when the second selection signal S2 on the row is set to the high potential, the output is read out through the second amplification circuit 15b and the second selection circuit 19b to the horizontal output-signal line $H_i$, and then, the signal converted into the digital signal by the direct current noise canceling circuit $DCC_j$ is transmitted through the output terminal $V_{OUT1}$ to the horizontal direction.

When the picture is imaged on the particular row, the first switch SW1 and the third switch SW3 in the vertical scanning circuit 23 are turned on by the inverted mode-exchange signal $V_{MODE}$. That is, in order to initialize the charge quantity of the charge-accumulation capacitor 12 on the row, the reset signal $V_{RST}$ in the pulse waveform is applied to the gate electrode of the reset-transistor Tr14, and the reset-transistor Tr14 is turned on. At this instantaneous time, the barrier transistor Tr17 is controlled to turn on by the switching signal $V_{TRS}$ in the pulse waveform. Consequently, the charge quantity of the charge-accumulation capacitor 12 is initialized in accordance with the reset voltage $V_R$. The reset-transistor Tr14 is controlled in off state by the pulse wave after the initialization. The barrier transistor Tr17 is also controlled to turn off by the switching signal $V_{TRS}$ in the pulse waveform after the initialization. Consequently, the cathode side of the photodiode 11 becomes in the floating state. Moreover, the barrier transistor Tr17 is controlled in off state in the charge accumulation period and turned on in the charge transfer period by the switching signal $V_{TRS}$ in the pulse waveform. When the light is irradiated to the cell $X_{ij}$ in the charge accumulation period, the charges are generated in the photodiode 11. When the generated charges are accumulated in the charge-accumulation capacitor 12, the input voltage $V_{FD}$ of the first amplification circuit 15a is decreased. After the elapse of a predetermined period, by the vertical scanning circuit 23, when the first selection signal S1 on the row is set to the high potential, and by the horizontal scanning circuit 22, when the second selection signal S2 on the row is set to the low potential, the output is read out through the first amplification circuit 15a and the first selection circuit 19a to the vertical output-signal line $B_{j1}$, and the noise is removed by the noise canceller circuit $NC_j$, and the picture signal is transmitted through the output terminal $V_{OUT2}$ to the vertical direction. In this way, the optical-communication signal can be received on the particular row, and simultaneously, the picture can be imaged on the different row.

In the information-acquisition device pertaining to the sixth embodiment of the present invention, by the horizontal scanning circuit 22, when the plurality of rows on the particular column are selected to receive the optical-communication signals and then the optical-communication signal information are extracted along the horizontal directions, respectively, it is possible for the plurality of cells (pixels) on the particular column to receive the optical-communication signals at the same time, and the optical-communication signals can be transmitted toward the horizontal directions, respectively.

According to the information-acquisition device pertaining to the sixth embodiment of the present invention, similarly to the first to fifth embodiment, it is possible to miniaturize the element occupation area, reduce the electric power consumption and suppress the noise. Especially, in the miniaturized structure, it is possible to provide the information-acquisition device that can acquire both of the picture-information and the optical-communication signal information, and then, process both of the picture-information and the optical-communication signal information. In particular, the information-acquisition device pertaining to the sixth embodiment is designed such that, since a plurality of optical-communication signal information can be extracted along the horizontal direction, by the employment of the mode at which the cells on the plurality of rows can receive the optical-communication signals at the same time, the very weak optical-communication signal can be detected at a higher sensitivity.

Moreover, in the information-acquisition device pertaining to the sixth embodiment, similarly to the first to fifth embodiments, because the reset-transistor Tr14 is operated in the weak inversion state in a period when the optical-communication signal is received, the optical-communication signal can be detected at a higher sensitivity.

Moreover, according to the information-acquisition device pertaining to the sixth embodiment of the present invention, by assembling the information-transmission unit that transmits the optical-communication signal with the information reception unit that has the information-acquisition device pertaining to the sixth embodiment, it is possible to provide an optical communication system of a high sensitivity, having a miniaturized shape with a smaller electric power consumption and a lower noise.

Other Embodiments

As mentioned above, the present invention has been described through the first to sixth embodiments. However, the first to sixth embodiments indicate only the exemplifications. The discussions and drawings that exhibit the part of this disclosure should not be understood to limit the present invention. From this disclosure, various variation embodiments, implementations and operational techniques would be evident for one skilled in the art.

For example, the first to sixth embodiments are explained by exemplifying the case in which the insulated-gate transistors, such as the reset-transistor Tr14, the barrier transistor Tr17, the buffer transistor Tr15, the selection transistor Tr19 and the like, are MOSFETs. However, those insulated-gate transistors are not limited to MOSFETs. Thus, it is possible to employ the various insulated-gate transistors such as an insulation gate static induction transistor (SIT) and the like. Moreover, a high electron mobility transistor (HEMT) and the like can be included in the insulated-gate transistor.

In particular, MOSSIT and MISSIT (hereafter, referred to as "MOSSIT or the like"), which can be considered to be an ultimate structure in a shorter channel structure of the MOSFET, may be used for the reset-transistor Tr14. The MOSSIT or the like can be interpreted as a semiconductor element in which a behavior of sub-threshold current in the MOSFET is positively utilized. However, with regard to the MOSSIT or the like, there is no concept of the threshold voltage and the sub-threshold regime. That is, the MOSSIT or the like is the semiconductor element in which in the weak inversion state, the diffusion current is injected through a potential barrier, which is provided on a front of a source region, into a drift region defined between a source and a drain, and a height of the potential barrier is controlled in accordance with a gate voltage. Thus, this indicates a current-voltage characteristic of triode type, in which a drain current exponentially increases with respect to a drain voltage. When the MOSSIT or the like is used as the reset-transistor Tr14, even if the very weak optical-communication signal is received, the drain current $I_d$ flowing through the reset-transistor Tr14 can be amplified to the large value. Thus, the input voltage $V_{FD}$ to the amplification circuit 15 can be increased, which can detect the optical-communication signal at a higher sensitivity. Moreover, since the MOSSIT or the like can be operated in a state at which the channel is depleted, the impurity concentration of the semiconductor layer 11b can be decreased. Hence, with the employment of the MOSSIT or the like, because the photodiode 11 can be made into a pin diode, the process matching and applicability for making the sensitivity of the photodiode 11 high become also excellent.

Moreover, for example, a multiplexer can be connected between the cell and the read-out circuit, so that only a selected cell can be connected to the read-out circuit, an then, the optical-communication signal information or the picture-information can be transmitted.

Also, in the configuration described in the sixth embodiment, when a plurality of horizontal output-signal lines connected to the analog/digital conversion circuit are provided to each row, the plurality of cells (pixels) for each row can be read out at the same time.

Also, the first to sixth embodiments are described under the assumption that the first conductivity type is p-type and the second conductivity type is n-type, and, in the already-described second embodiment, as an example such that pMOS-FET is used for the reset-transistor Tr14 instead of nMOS-FET, which was disclosed in the first embodiment, is described. However, in the first to sixth embodiment, even if the first conductivity type is assumed to be n-type and the second conductivity type is p-type, subject matters such that the same effectiveness can be achieved may be easily understood, as far as electric polarities are made opposite. If the first conductivity type is n-type and the second conductivity type is p-type, nomenclature, or names of the constituent elements and the like may be properly changed in accordance with the inversion of the polarities. For example, the surface-buried region 11a shown in FIG. 8 shall be referred as "the light-reception anode region".

Moreover, in the explanations of the first to sixth embodiments, the two-dimensional solid-state imaging devices (area sensors) are described as the examples. However, the pixels of the present invention should not be limitedly construed, such that the pixels are used only in the array of two-dimensional solid-state imaging device. For example, from the subject matters recited in the above disclosure, it will be easily understood that, if i=n=1 is assumed in the two-dimensional matrix shown in FIG. 2, a configuration that a plurality of cells (pixels) are arrayed along one-dimensional direction so as to implement a one-dimensional solid-state imaging device (line sensor) can be established.

Also, the technical features described in this specification or drawings can achieve specific technical advantages under the single situation or various combinations as a whole, and the technical features should not be limited to only the disclosed subject matters recited in the first to sixth embodiments. Also, the techniques exemplified in this specification or drawings may include the aspect in which the plurality of objects can be achieved at the same time. Thus, depending on the aspect of invention, only the achievement of one object among them should not be limitedly construed to have the technical availability.

In this way, naturally, the present invention encompasses various embodiments and the like that are not described herein. Thus, the technical scope of the present invention is determined only by the particular subject matters defining the invention, which are described in claims, as far as the technical scope can be construed to be reasonable from the above explanation.

INDUSTRIAL APPLICABILITY

The information-acquisition device of the present invention can be used in the various industries that require techniques for receiving a very weak optical-communication signal at a higher sensitivity. In particular, the present invention can be addressed to the various industries that require techniques, to which the miniaturization of the element occupation area implementing the information-acquisition device, the reduction in the electric power consumption of the information-acquisition device, the suppression of the noise in the information-acquisition device, and the like, are directed.

For example, in the information-acquisition device of the present invention, an operational mode at which both of the picture-information and the optical-communication signal information are acquired and process can be achieved, in addition to the miniaturized structure. Thus, the present invention can be applied to an industrious field, when a computer network is established in an office and the like, allocations of respective apparatuses such as personal computers and the like are detected on the basis of the picture-information obtained by the information-acquisition device of the present invention, and further, at a stage when the allocations of the respective apparatuses are determined, light beams for optical communication are used between the respective apparatuses, and then a data communication is carried out between each other by the light beams.

Also, because an optical communication system can be provided by assembling a information-transmission unit that transmits the optical-communication signal with the information reception unit that has the information-acquisition device of the present invention, the optical communication systems can be applied to industrious fields related to automobiles and information communication, in which communication with ground facilities such as road signs, signals or the like and inter-vehicle communication are carried out by intelligent traffic system (ITS), and further, the optical communication systems can be applied to wide fields such as physical distributions and tourisms that require optical communication systems of a higher sensitivity, a miniaturized scale, a smaller electric power consumption and a low noise.

The invention claimed is:

1. An information-acquisition device comprising:
   a sensor array in which a plurality of cells are arrayed; and
   a peripheral circuit configured to control an operation of each of the cells and to process signals transmitted from each of the cells, wherein
   at least one cell among the plurality of cells comprises a photoelectric-conversion accumulation element configured to generate and accumulate signal charges, a potential detection circuit configured to detect the signal charges generated by the photoelectric-conversion accumulation element as a potential change, and an amplification circuit configured to amplify the potential change and to transmit to an output-signal line, and
   the photoelectric-conversion accumulation element and the potential detection circuit are connected in series between a first potential terminal and a second potential terminal, and the potential detection circuit has an insulated-gate transistor, which is directly connected to the photoelectric-conversion accumulation element, the insulated-gate transistor configured to detect the potential change in a weak inversion state, in a period when an optical-communication signal is received.

2. The information-acquisition device of claim 1, wherein each of the plurality of cells comprises the photoelectric-conversion accumulation element, the potential detection circuit and the amplification circuit, and
   in each of the plurality of cells, as the insulated-gate transistor turns into a conductive state, the insulated-gate transistor serves as a reset-transistor configured to reset the charges accumulated in the photoelectric-conversion accumulation element, and after the reset, as the insulated-gate transistor turns into a cut-off state, the signal charges are accumulated as picture-information in the photoelectric-conversion accumulation element, and the amplification circuit amplifies the potential change as the picture-information and transmits the picture-information to the output-signal line.

3. The information-acquisition device of claim 2, wherein the peripheral circuit transmits signals for setting each of the insulated-gate transistors to weak inversion state, conductive state and cut-off state to respective gate electrodes of the insulated-gate transistors, respectively.

4. The information-acquisition device of claim 2, wherein each of the plurality of cells further comprises a charge transfer circuit between the photoelectric-conversion accumulation element and the potential detection circuit.

5. The information-acquisition device of claim 2, wherein the plurality of cells are arrayed in a shape of a matrix in the sensor array.

6. The information-acquisition device of claim 5, wherein each of the plurality of cells further comprises a selection circuit configured to select the cell on a particular row inside the matrix-shaped array.

7. The information-acquisition device of claim 2, wherein in each of the plurality of cells, the amplification circuit is assigned as a first amplification circuit configured to amplify the potential change as the picture-information and to transmit the picture-information to a first output-signal line, and each of the plurality of cells further comprises a second amplification circuit configured to amplify the potential change, which is caused by the signal charges resulting from the optical-communication signal, when the optical-communication signal is received, and to transmit the potential change by the optical-communication signal to a second output-signal line.

8. The information-acquisition device of claim 7, wherein the plurality of cells are arrayed in a shape of a matrix in the sensor array.

9. The information-acquisition device of claim 8, wherein each of the plurality of cells further comprises:
a first selection circuit configured to select the cell on a particular row in the matrix-shaped array between the first amplification circuit and the first output-signal line and
a second selection circuit configured to select the cell on a particular row in the matrix-shaped array between the second amplification circuit and the second output-signal line.

10. An optical communication system comprising:
an information-transmission unit configured to transmit an optical-communication signal; and
an information reception unit having an information-acquisition device comprising:
a sensor array in which a plurality of cells are arrayed, and
a peripheral circuit configured to control an operation of each of the cells and to process signals transmitted from each of the cells, wherein
at least one cell among the plurality of cells comprises a photoelectric-conversion accumulation element configured to generate and accumulate signal charges, a potential detection circuit configured to detect the signal charges generated by the photoelectric-conversion accumulation element as a potential change, and an amplification circuit configured to amplify the potential change and to transmit to an output-signal line, and
the photoelectric-conversion accumulation element and the potential detection circuit are connected in series between a first potential terminal and a second potential terminal, and the potential detection circuit has an insulated-gate transistor, which is directly connected to the photoelectric-conversion accumulation element, the insulated-gate transistor configured to detect the potential change in a weak inversion state, in a period when an optical-communication signal is received.

11. The optical communication system of claim 10, wherein each of the plurality of cells comprises the photoelectric-conversion accumulation element, the potential detection circuit and the amplification circuit, and
in each of the plurality of cells, as the insulated-gate transistor turns into a conductive state, the insulated-gate transistor serves as a reset-transistor configured to reset the charges accumulated in the photoelectric-conversion accumulation element, and after the reset, as the insulated-gate transistor turns into a cut-off state, the signal charges are accumulated as picture-information in the photoelectric-conversion accumulation element, and the amplification circuit amplifies the potential change as the picture-information and transmits the picture-information to the output-signal line.

12. The optical communication system of claim 11, wherein the peripheral circuit transmits signals for setting each of the insulated-gate transistors to weak inversion state, conductive state and cut-off state to respective gate electrodes of the insulated-gate transistors, respectively.

* * * * *